(12) United States Patent
Liu et al.

(10) Patent No.: US 11,469,254 B2
(45) Date of Patent: Oct. 11, 2022

(54) ARRAY SUBSTRATE AND MANUFACTURING METHOD THEREOF, DISPLAY PANEL AND ELECTRONIC DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Peng Liu, Beijing (CN); Fuqiang Li, Beijing (CN); Jun Fan, Beijing (CN); Bailing Liu, Beijing (CN); Jianjun Zhang, Beijing (CN); Yusheng Liu, Beijing (CN); Mei Li, Beijing (CN)

(73) Assignees: Ordos Yuansheng Optoelectronics Co., Ltd., Inner Mongolia (CN); Beijing BOE Technology Development Co., Ltd., Beijing (CN)

( * ) Notice: Subject to any disclaimer, the term of this patent is extended or adjusted under 35 U.S.C. 154(b) by 328 days.

(21) Appl. No.: 16/605,588

(22) PCT Filed: Apr. 8, 2019

(86) PCT No.: PCT/CN2019/081773
§ 371 (c)(1),
(2) Date: Oct. 16, 2019

(87) PCT Pub. No.: WO2019/205922
PCT Pub. Date: Oct. 31, 2019

(65) Prior Publication Data
US 2021/0408081 A1   Dec. 30, 2021

(30) Foreign Application Priority Data

Apr. 26, 2018   (CN) .................. 201810386494.X

(51) Int. Cl.
*H01L 27/12* (2006.01)
*G06F 3/041* (2006.01)
(Continued)

(52) U.S. Cl.
CPC .... *H01L 27/1225* (2013.01); *G02F 1/136227* (2013.01); *G06F 3/0412* (2013.01);
(Continued)

(58) Field of Classification Search
CPC ............ H01L 27/1225; H01L 27/1251; H01L 29/7869; H01L 27/124; H01L 27/127;
(Continued)

(56) References Cited

U.S. PATENT DOCUMENTS 9,568,800 B1    2/2017  Sprague
11,107,429 B2 *  8/2021  Kikuchi ............... G09G 3/3648
(Continued)

FOREIGN PATENT DOCUMENTS

CN    104538352 A    4/2015
CN    104867937 A    8/2015
(Continued)

*Primary Examiner* — Xuemei Zheng
(74) *Attorney, Agent, or Firm* — Leason Ellis LLP

(57) ABSTRACT

An array substrate, a method of manufacturing an array substrate, a display panel, and an electronic device are provided. The array substrate includes a display area and a peripheral area; the display area includes a pixel region, the pixel region includes a first thin film transistor, and the first thin film transistor includes a first active layer; the peripheral area includes a second thin film transistor, and the second thin film transistor includes a second active layer; and the first active layer includes a material of oxide semiconductor, and the second active layer includes a material of polysilicon semiconductor.

19 Claims, 10 Drawing Sheets

(51) Int. Cl.
*H01L 29/786* (2006.01)
*H01L 29/66* (2006.01)
*G02F 1/1362* (2006.01)
*G06F 3/044* (2006.01)

(52) U.S. Cl.
CPC ........ *G06F 3/04164* (2019.05); *H01L 27/124* (2013.01); *H01L 27/127* (2013.01); *H01L 27/1251* (2013.01); *H01L 29/66969* (2013.01); *H01L 29/7869* (2013.01); *H01L 29/78675* (2013.01); *G06F 3/044* (2013.01); *G06F 2203/04103* (2013.01); *H01L 27/1222* (2013.01); *H01L 27/1248* (2013.01); *H01L 29/66757* (2013.01)

(58) Field of Classification Search
CPC ........... H01L 27/1222; H01L 29/66969; H01L 29/78675; G06F 3/0412; G06F 3/044; G06F 3/4164; G02F 1/136227
See application file for complete search history.

(56) References Cited

U.S. PATENT DOCUMENTS

| | | | |
|---|---|---|---|
| 2015/0243724 A1* | 8/2015 | Cho | H01L 27/1251 257/43 |
| 2015/0364507 A1* | 12/2015 | Won | G06F 3/0412 257/43 |
| 2016/0247831 A1* | 8/2016 | Makita | H01L 27/1248 |
| 2016/0349559 A1* | 12/2016 | Woo | G02F 1/13338 |
| 2017/0031489 A1* | 2/2017 | Kim | H01L 29/518 |

FOREIGN PATENT DOCUMENTS

| | | |
|---|---|---|
| CN | 106200064 A | 12/2016 |
| CN | 108598087 A | 4/2018 |

* cited by examiner

ARRAY SUBSTRATE AND MANUFACTURING METHOD THEREOF, DISPLAY PANEL AND ELECTRONIC DEVICE

CROSS-REFERENCE TO RELATED PATENT APPLICATIONS

This application is a U.S. National Stage Application under 35 U.S.C. § 371 of International Patent Application No. PCT/CN2019/081773, filed Apr. 8, 2019, which claims priority to Chinese patent application No. 201810386494.X, filed on Apr. 26, 2018, entitled "ARRAY SUBSTRATE AND MANUFACTURING METHOD THEROF, DISPLAY PANEL AND ELECTRONIC DEVICE", both of which are incorporated herein by reference as part of the present application.

TECHNICAL FIELD

Embodiments of the present disclosure relate to an array substrate, a method of manufacturing an array substrate, a display panel, and an electronic device.

BACKGROUND

In the field of active matrix display, thin film transistor (TFT) technology is one of the core technologies in this field. A thin film transistor includes structures, such as a gate electrode, a gate insulating layer, an active layer, a source electrode, a drain electrode, etc. Thin film transistors are widely used as pixel switching components or drive circuit components in various display devices, and these display devices may be, for example, liquid crystal displays, organic light-emitting diode displays, electronic paper displays, etc. The pixel array of the display device is usually defined and formed by a plurality of rows of gate lines and a plurality of columns of data lines in an intersecting arrangement. In the sub-pixel unit, the thin film transistor is used as a switching component, and under control of the gate electrode, external data signals can be input to the pixel electrode in the sub-pixel unit through the thin film transistor, thereby implementing charging and discharging of the sub-pixel unit.

Generally, the driving of gate lines can be implemented by an integrated drive circuit (IC chip) bonded on the array substrate. In recent years, with the continuous development of the manufacturing process of amorphous silicon thin film transistors or oxide thin film transistors, the gate drive circuit can also be directly prepared and integrated on the array substrate to form a GOA (Gate driver On Array) gate drive circuit to drive the gate lines. For example, the GOA gate drive circuit composed of a plurality of cascaded shift register units can be used to provide switching state voltage signals for the plurality of rows of gate lines of the pixel array, for example, to control the plurality of rows of gate lines to be sequentially turned on. The GOA technology is conducive to implementing a narrow bezel of the display device, and can decrease the production cost.

SUMMARY

At least an embodiment of the present disclosure provides an array substrate, comprising a display area and a peripheral area. The display area comprises a pixel region, the pixel region comprising a first thin film transistor, and the first thin film transistor comprising a first active layer; the peripheral area comprises a second thin film transistor, the second thin film transistor comprising a second active layer; and the first active layer comprises a material of oxide semiconductor, and the second active layer comprises a material of poly-silicon semiconductor.

For example, in one or more embodiments of the present disclosure, the array substrate further comprises a base substrate and an interlayer insulating layer on the base substrate. A first gate electrode of the first thin film transistor and the first active layer of the first thin film transistor are both on a side of the interlayer insulating layer away from the base substrate, and a second gate electrode of the second thin film transistor and the second active layer of the second thin film transistor are both on a side of the interlayer insulating layer near the base substrate.

For example, in one or more embodiments of the present disclosure, the array substrate further comprises a first passivation layer on a side of the interlayer insulating layer away from the base substrate, and a second passivation layer on a side of the first passivation layer away from the base substrate. The pixel region further comprises a first display electrode and a second display electrode, the first display electrode is on a side of the first passivation layer away from the base substrate, and the second passivation layer covers the first display electrode; and the second display electrode is on a side of the second passivation layer away from the base substrate, and is electrically connected to a first source-drain electrode of the first thin film transistor through a first via hole in the first passivation layer and the second passivation layer.

For example, in one or more embodiments of the present disclosure, the display area further comprises a touch wire; the touch wire, the first source-drain electrode of the first thin film transistor and a second source-drain electrode of the first thin film transistor are in a same layer, or the touch wire, a first source-drain electrode of the second thin film transistor and a second source-drain electrode of the second thin film transistor are in a same layer; and the touch wire is electrically connected to the first display electrode.

For example, in one or more embodiments of the present disclosure, the display area further comprises a first connection electrode, the first connection electrode and the second display electrode being in a same layer, and the first connection electrode allowing the touch wire and the first display electrode to be electrically connected through a second via hole in the first passivation layer and the second passivation layer and a third via hole in the second passivation layer.

For example, in one or more embodiments of the present disclosure, the first connection electrode and the second display electrode are insulated from each other.

For example, in one or more embodiments of the present disclosure, the peripheral area at least comprises a GOA gate drive circuit, the GOA gate drive circuit comprising the second thin film transistor, and the second source-drain electrode of the second thin film transistor being electrically connected to the first gate electrode of the first thin film transistor through a gate line. The first source-drain electrode of the second thin film transistor, the second source-drain electrode of the second thin film transistor, and the first gate electrode of the first thin film transistor are in a same layer; and the gate line and the second gate electrode of the second thin film transistor are in a same layer.

For example, in one or more embodiments of the present disclosure, the gate line and the second gate electrode are insulated from each other.

For example, in one or more embodiments of the present disclosure, the peripheral area further comprises a connection region, and the connection region comprises a first electrode, a second electrode, and a second connection electrode. The first electrode, the first source-drain electrode of the first thin film transistor, and the second source-drain electrode of the first thin film transistor are in a same layer; the second electrode, the first source-drain electrode of the second thin film transistor, and the second source-drain electrode of the second thin film transistor are in a same layer; and the second connection electrode and the second display electrode are in a same layer, and the second connection electrode allows the first electrode and the second electrode to be electrically connected through a fourth via hole in the first passivation layer and the second passivation layer and a fifth via hole in the first passivation layer and the second passivation layer.

For example, in one or more embodiments of the present disclosure, the peripheral area further comprises a bonding region, the bonding region comprising a fourth electrode, a fifth electrode, and a third connection electrode. The fourth electrode, the first source-drain electrode of the second thin film transistor, and the second source-drain electrode of the second thin film transistor are in a same layer; the fifth electrode and the second gate electrode of the second thin film transistor are in a same layer; and the third connection electrode and the second display electrode are in a same layer, and the fourth electrode, the fifth electrode and the third connection electrode are electrically connected to each other.

For example, in one or more embodiments of the present disclosure, the array substrate further comprises a first passivation layer on a side of the interlayer insulating layer away from the base substrate, and a second passivation layer on a side of the first passivation layer away from the base substrate. The pixel region further comprises a first display electrode and a second display electrode, the second display electrode being on a side of the first passivation layer away from the base substrate, and the second passivation layer covering the second display electrode; the first display electrode is on a side of the second passivation layer away from the base substrate; the array substrate further comprises a fourth connection electrode, the fourth connection electrode and the first display electrode being in a same layer and insulated from each other; and the second display electrode is electrically connected to the first source-drain electrode of the first thin film transistor through the fourth connection electrode.

At least one embodiment of the present disclosure also provides a display panel, comprising any of the array substrates.

At least one embodiment of the present disclosure also provides an electronic device, comprising any of the display panels.

At least one embodiment of the present disclosure also provides a method of manufacturing an array substrate. The array substrate comprises a display area and a peripheral area, the display area comprising a pixel region, and the method comprises: forming a first thin film transistor in the pixel region, the forming of the first thin film transistor comprising forming a first active layer; and forming a second thin film transistor in the peripheral area, the forming of the second thin film transistor comprising forming a second active layer. The first active layer comprises a material of oxide semiconductor, and the second active layer comprises a material of poly-silicon semiconductor.

For example, in one or more embodiments of the present disclosure, the peripheral area at least comprises a GOA gate drive circuit, the GOA gate drive circuit comprising the second thin film transistor, and the method further comprises: patterning a first conductive thin film to form a gate line and a second gate electrode of the second thin film transistor; and patterning a second conductive thin film to form a first source-drain electrode of the second thin film transistor, a second source-drain electrode of the second thin film transistor, and a first gate electrode of the first thin film transistor. The second source-drain electrode of the second thin film transistor is electrically connected to the first gate electrode of the first thin film transistor through the gate line.

For example, in one or more embodiments of the present disclosure, the method further comprises forming a touch wire in the display area. A first source-drain electrode of the first thin film transistor and a second source-drain electrode of the first thin film transistor are formed by patterning a third conductive thin film, and the touch wire, the first source-drain electrode of the first thin film transistor, and the second source-drain electrode of the first thin film transistor are simultaneously formed; or the touch wire, the first source-drain electrode of the second thin film transistor, and the second source-drain electrode of the second thin film transistor are simultaneously formed.

For example, in one or more embodiments of the present disclosure, the array substrate further comprises a base substrate, and the method further comprises: forming a first passivation layer and a second passivation layer sequentially on the base substrate to cover the first thin film transistor and the second thin film transistor; forming a first display electrode between the first passivation layer and the second passivation layer in the pixel region; after the second passivation layer is formed, forming a first via hole by an etching process to expose the first source-drain electrode of the first thin film transistor, forming a second via hole to expose the touch wire, and forming a third via hole to expose the first display electrode; and forming a fourth conductive thin film and patterning the fourth conductive thin film to form a second display electrode and a first connection electrode. The second display electrode and the first connection electrode are insulated from each other, the second display electrode is electrically connected to the first source-drain electrode of the first thin film transistor through the first via hole, and the first connection electrode is electrically connected to the touch wire and the first display electrode through the second via hole and the third via hole, respectively.

For example, in one or more embodiments of the present disclosure, the method further comprises: forming a first electrode and a second electrode in a connection region of the peripheral area. The first source-drain electrode of the first thin film transistor, the second source-drain electrode of the first thin film transistor, and the first electrode are simultaneously formed, and the first source-drain electrode of the second thin film transistor, the second source-drain electrode of the second thin film transistor, and the second electrode are simultaneously formed; forming a fourth via hole to expose the second electrode and forming a fifth via hole to expose the first electrode. The first via hole, the second via hole, the third via hole, the fourth via hole, and the fifth via hole are simultaneously formed; and forming a second connection electrode. The second display electrode and the second connection electrode are simultaneously formed, and the second connection electrode allows the first electrode and the second electrode to be electrically connected through the fourth via hole and the fifth via hole.

For example, in one or more embodiments of the present disclosure, the method further comprises: forming a fourth electrode and a fifth electrode in a bonding region of the peripheral area. The first source-drain electrode of the second thin film transistor, the second source-drain electrode of the second thin film transistor, and the fourth electrode are simultaneously formed, and the second gate electrode of the second thin film transistor and the fifth electrode are simultaneously formed; forming a sixth via hole to expose at least one of the fourth electrode and the fifth electrode. The first via hole, the second via hole, the third via hole, the fourth via hole, the fifth via hole, and the sixth via hole are simultaneously formed; and forming a third connection electrode. The third connection electrode and the second display electrode are simultaneously formed, and the fourth electrode, the fifth electrode, and the third connection electrode are electrically connected to each other.

For example, in one or more embodiments of the present disclosure, the first via hole, the second via hole, the third via hole, the fourth via hole, the fifth via hole, and the sixth via hole are formed by using a same mask.

BRIEF DESCRIPTION OF THE DRAWINGS

A brief description will be given below to the accompanying drawings of the embodiments to provide a more clear understanding of the technical proposals of the embodiments of the present disclosure. Apparently, the drawings described below only involve some embodiments of the present disclosure but are not intended to limit the present disclosure.

DETAILED DESCRIPTION

Figure 1A:
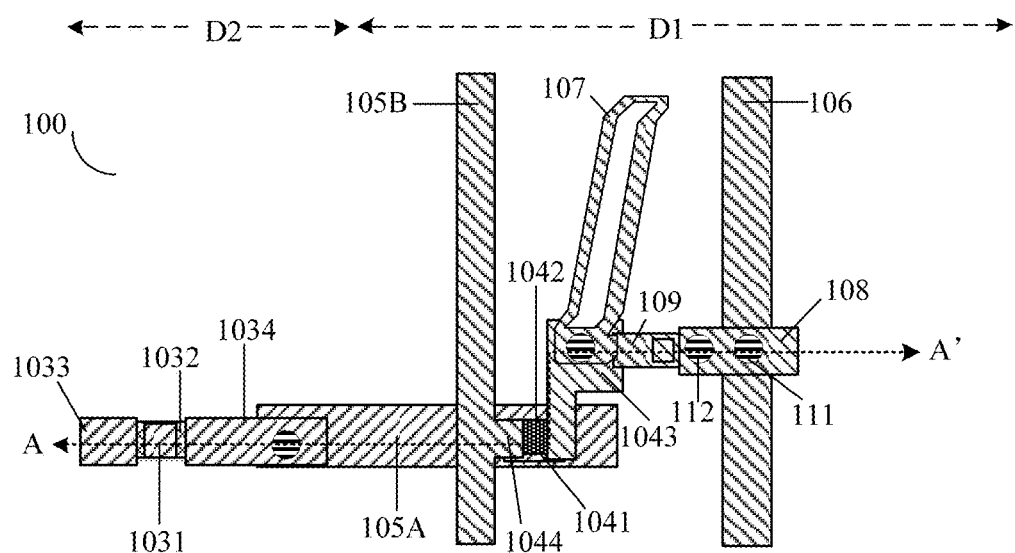
FIG. 1A is a schematically structural plan diagram of an array substrate provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, one of ordinary skill in the art can obtain other embodiment(s), without any inventive work, which is to be within the scope of the disclosure.

Unless otherwise defined, all the technical and scientific terms used herein have the same meanings as commonly understood by one of ordinary skill in the art to which the present disclosure belongs. The terms, such as 'first,' 'second,' or the like, which are used in the description and the claims of the present disclosure, are not intended to indicate any sequence, amount or importance, but for distinguishing various components. Also, the terms, such as "a," "an," or "the", are not intended to limit the amount, but may indicate the existence of at least one. The terms, such as 'comprise/comprising,' 'include/including,' or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or a mechanical connection, but may include an electrical connection/coupling, directly or indirectly. The terms, 'on,' 'under,' 'left,' 'right,' or the like are only used to indicate relative position relationship, and when the absolute position of the object which is described is changed, the relative position relationship may be changed accordingly.

The thin film transistor is one of the core components in the display panel, and the performance of the thin film transistor has an effect on the display quality of the display panel in a large extent. The thin film transistor generally includes structures, such as a gate electrode, a source electrode, a drain electrode, a gate insulating layer, an active layer, etc. According to the material type of the active layer of the thin film transistor, the thin film transistor can be classified into the amorphous silicon thin film transistor, the poly-silicon thin film transistor (for example, the low temperature poly-silicon thin film transistor, the high temperature poly-silicon thin film transistor, etc.), the oxide thin film transistor, etc.

Although the electrical uniformity of the amorphous silicon thin film transistor is better, the mobility of the amorphous silicon thin film transistor is low and the stability of the amorphous silicon thin film transistor is poor. The low temperature poly-silicon thin film transistor has high mobility and good stability, but the electrical uniformity of the low temperature poly-silicon thin film transistor is poor and the off-state leakage current is large, which is easy to cause defects, such as flicker, or image retention, and increases the power consumption of the display panel, so that the display panel is difficult to achieve a high refresh frequency. Compared with the amorphous silicon thin film transistor and the low temperature poly-silicon thin film transistor, the oxide thin film transistor has higher mobility, better stability and better electrical uniformity, and the oxide thin film transistor allows the display panel to be easier to achieve a high refresh frequency and a large size, and has a good application prospect.

For example, currently in the display area of the array substrate of the liquid crystal display device, low temperature poly-silicon thin film transistors are usually used. In the process of forming the low temperature poly-silicon thin film transistor, the amorphous silicon active layer of the thin film transistor usually needs to be crystallized to form the poly-silicon active layer. Therefore, there are usually many "grain boundaries" in the low temperature poly-silicon thin film transistor, which allows the low temperature poly-silicon thin film transistor to be difficult to achieve large-area electrical uniformity. In addition, the "grain boundary"

provides a leakage path for the low temperature poly-silicon thin film transistor. In a case where the low temperature poly-silicon thin film transistor generates an undesired off-state leakage current, the contrast ratio of the display device which includes the array substrate including the low temperature poly-silicon thin film transistor is usually decreased, and the display quality of the display device is low.

At least one embodiment of the present disclosure provides an array substrate, and the array substrate includes a display area and a peripheral area. The display area includes a pixel region, the pixel region including a first thin film transistor, and the first thin film transistor including a first active layer. The peripheral area includes a second thin film transistor, the second thin film transistor including a second active layer, and the material of the second active layer is different from the material of the first active layer. In the array substrate provided by the present embodiments, thin film transistors of different material types are respectively disposed in the display area and the peripheral area of the array substrate. For example, according to requirements, the first thin film transistor in the display area may be an oxide thin film transistor, and the second thin film transistor in the peripheral area may be a poly-silicon thin film transistor.

For example, the array substrate provided by the embodiments of the present disclosure can be used in a horizontal-electric-field-type liquid crystal display device and a vertical-electric-field-type liquid crystal display device, and can also be used in, for example, an organic light-emitting-diode display device, an electronic paper display device, etc.

Because the oxide thin film transistor has the characteristics, such as high mobility, good stability, good electrical uniformity, low off-state leakage current, etc., in a case where the display area of the array substrate is provided with the first thin film transistor, in which the oxide semiconductor material is used as the active layer, as the switching component of the sub-pixel unit, compared to being provided with other types of thin film transistors, the contrast ratio of the display area of the display device including the array substrate can be improved, the power consumption of the display device can be reduced, and the display quality of the display device can be improved. Because the poly-silicon thin film transistor has high mobility and good stability, in a case where the drive circuit in the peripheral area of the array substrate is provided with the second thin film transistor in which the poly-silicon is used as the active layer, compared to being provided with, for example, the amorphous silicon thin film transistor, the drive circuit can have a higher driving capability and a higher refresh frequency. Therefore, the embodiments of the present disclosure can make full use of the excellent characteristics of different types of thin film transistors in one array substrate, so as to achieve a display panel with a higher refresh frequency and a larger size, and with a better and more stable driving effect and display effect.

The present disclosure will be described below with reference to several specific embodiments. In order to make the following description clear and concise, detailed descriptions of known functions and known components may be omitted in the embodiments of the present disclosure. In a case where any component of the embodiments of the present disclosure appears in more than one of the accompanying drawings, the component may be indicated by the same reference numeral in each of the accompanying drawings.

Figure 1B:
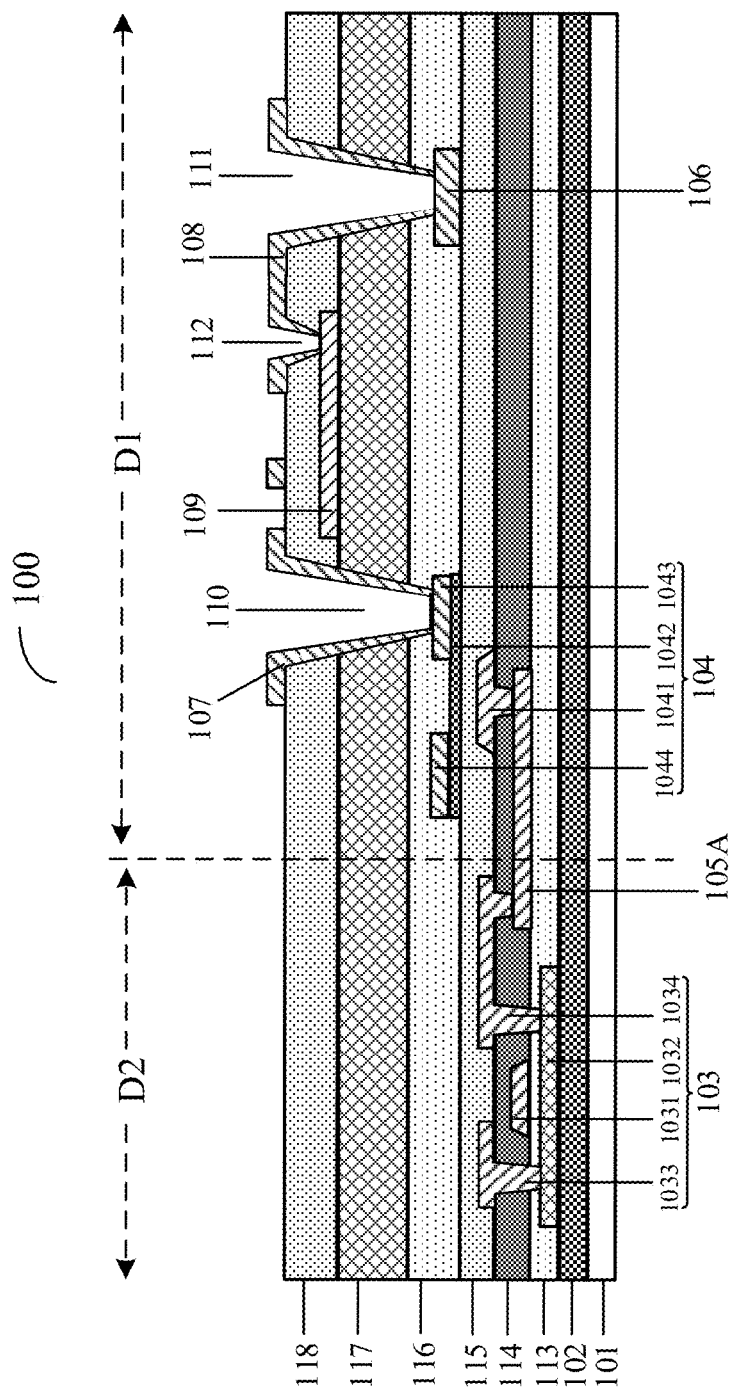
FIG. 1B is a schematically structural cross-section view taken along a line A-A' in FIG. 1A.

At least an embodiment of the present disclosure provides an array substrate 100. FIG. 1A is a schematically structural plan diagram of the array substrate, and FIG. 1B is a schematically structural cross-section view taken along a line A-A' in FIG. 1A. The array substrate 100 may be an array substrate used in a liquid crystal display device, and specifically may be an array substrate of a horizontal-electric-field-type liquid crystal display device. The embodiments of the present disclosure use the liquid crystal display device as an example for description, but the embodiments of the present disclosure are not limited thereto.

For example, as illustrated in FIG. 1A and FIG. 1B, the array substrate 100 includes a display area D1 and a peripheral area D2. The display area D1 includes pixel regions corresponding to sub-pixel units, and other components, such as gate lines 105A, data lines 105B, touch wires 106, etc.; and the pixel regions include first thin film transistors 104. The peripheral area D2 includes second thin film transistors 103 corresponding to the drive circuit. Here, the material of the active layer of the first thin film transistor 104 is different from the material of the active layer of the second thin film transistor 103. For example, the peripheral area D2 includes a GOA gate drive circuit, and the GOA gate drive circuit includes a plurality of cascaded GOA shift register units. Each of the GOA shift register units generally includes a plurality of thin film transistors and capacitors, and the output terminal of each shift register unit outputs scanning signals. For example, in an embodiment, the second thin film transistor 103 may be an output transistor of the signal output terminal of the GOA gate drive circuit. For example, each GOA shift register unit is connected to one gate line 105A in the display area to provide the gate scanning signal for the gate line 105A at a predetermined phase.

For example, input signals of the GOA gate drive circuit include clock signals, the turn-on signal STV (i.e., the shift trigger signal SR_IN), the high level signal VGH, the low level signal VGL, and so on. The clock signals may include a first clock signal CLK1 and a second clock signal CLK2 to provide clock signals for sub-circuits of the GOA gate drive circuit. Based on structures of different circuits, the number of the clock signals is not limited to two, and one or more than two clock signals may be provided. The high level signal VGH and the low level signal VGL are used to provide constant voltage signals for the GOA gate drive circuit and the sub-pixels of the array substrate. Based on structures of different circuits, one high level signal VGH and one low level signal VGL may be required, or a plurality of high level signals VGH and a plurality of low level signals VGL may be required, and the embodiments of the present disclosure are not limited in this aspect.

Figure 2:
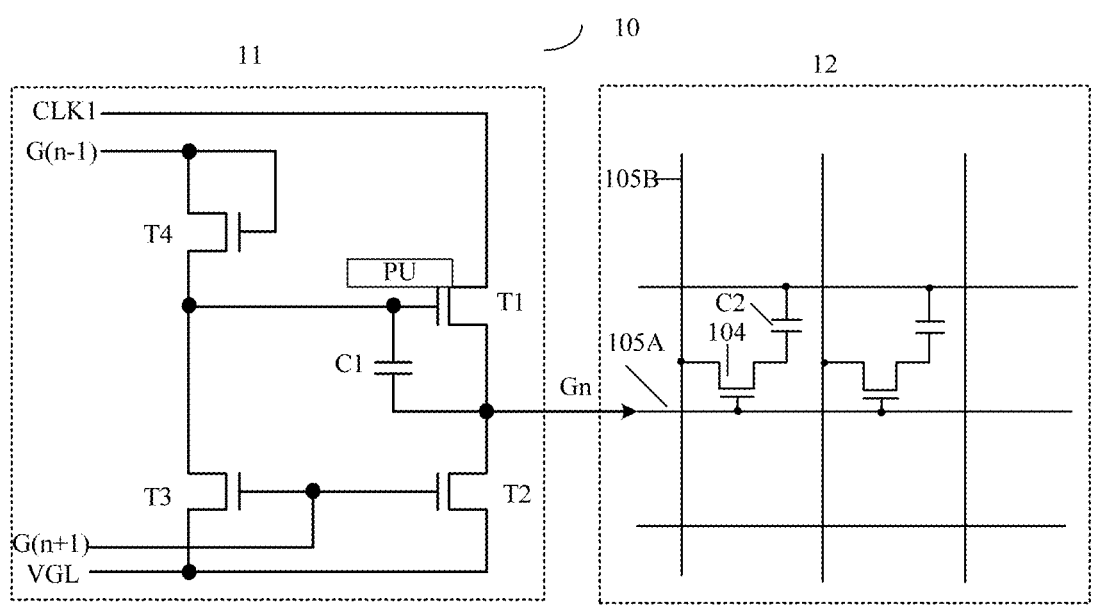
FIG. 2 is a circuit structural diagram of a GOA gate drive circuit.

For example, FIG. 2 is a diagram of a partial circuit structure of the array substrate 100. As illustrated in FIG. 2, a circuit 10 includes a GOA gate drive circuit 11 and a sub-pixel circuit 12. In the array substrate 100, the plurality of gate lines 105A and the plurality of data lines 105B are arranged in an array and are intersected to each other to define the plurality of sub-pixel units, and each of the sub-pixel units generally includes at least one first thin film transistor 104 and at least one liquid crystal capacitor C2. The first thin film transistor 104 acts as a switching component, and is connected to the gate line 105A, the data line 105B, and the pixel electrode 107, respectively. The pixel electrode 107 and the common electrode 109 respectively act as two electrodes of the liquid crystal capacitor C2. The first thin film transistor 104 is under control of the gate scanning signal provided by the gate line 105A to apply the data signals provided by the data line 105B to the liquid crystal capacitor C2 to allow the liquid crystal capacitor C2 to be charged. In this way, the deflection of liquid crystal molecules is controlled.

As illustrated in FIG. 2, the shift register unit, corresponding to sub-pixel units in the n-th row (n is greater than or equal to 2), of the GOA gate drive circuit 11 includes a first transistor T1, a second transistor T2, a third transistor T3, a fourth transistor T4, and a storage capacitor C1.

The first transistor T1 in the shift register unit is an output transistor of the signal output terminal of the shift register unit, that is, the second thin film transistor 103 in the peripheral area D2 as illustrated in FIG. 1B. For example, the first electrode of the first transistor T1 is connected to the first clock signal CLK1, the second electrode of the first transistor T1 is connected to the first electrode of the second transistor T2 to obtain the output terminal of the shift register unit, and can output the gate scanning signal Gn for sub-pixel units in the $n^{th}$ row and the input signal for the next shift register unit can be output. For example, the gate scanning signal Gn is a square wave pulse signal, accordingly, the pulse portion represents the turn-on level, and the non-pulse portion represents the turn-off level. The gate electrode of the first transistor T1 is connected to a pull-up node PU, thereby being connected to the first electrode of the third transistor T3 and the second electrode of the fourth transistor T4.

The second electrode of the second transistor T2 is connected to the second electrode of the third transistor T3 and the low level signal VGL. The gate electrode of the second transistor T2 is connected to the gate electrode of the third transistor T3 and the output terminal of the next shift register unit, i.e., the $(n+1)^{th}$ shift register unit, to receive the gate scanning signal G(n+1) as an output pull-down control signal. The first electrode of the second transistor T2 is connected to the second electrode of the first transistor T1. In this way, the second transistor T2 can be turned on under control of the pull-down control signal, and the output signal of the output terminal can be pulled down to the low level signal VGL in a case where the gate scanning signal Gn is not required to be output.

The first electrode of the third transistor T3 is also connected to the pull-up node PU, and to be electrically connected to the second electrode of the fourth transistor T4 and the gate electrode of the first transistor T1. The second electrode of the third transistor T3 is connected to the low level signal VGL. The gate electrode of the third transistor T3 is also connected to the output terminal of the next shift register unit, i.e., the $(n+1)^{th}$ shift register unit, to receive the gate scanning signal G(n+1) as a reset control signal (which is also the output pull-down control signal). In this way, the third transistor T3 can be turned on under control of the reset control signal to reset the pull-up node PU to the low level signal VGL, and to turn off the first transistor T1.

The first electrode of the fourth transistor T4 and the gate electrode of the fourth transistor T4 are connected, and are further connected to the output terminal of the previous shift register unit, i.e., the $(n-1)^{th}$ shift register unit, to receive the gate scanning signal G(n-1) as an input signal (and an input control signal), and the second electrode of the fourth transistor T4 is connected to the pull-up node PU. In this way, in a case where the fourth transistor T4 is turned on, the pull-up node PU can be charged, so that the voltage of the pull-up node PU can allow the first transistor T1 to be turned on, and to allow the first clock signal CLK1 to be output through the output terminal. One electrode of the storage capacitor C1 is connected to the gate electrode of the first transistor T1, that is, the pull-up node PU, and another electrode of the storage capacitor C1 is connected to the second electrode of the first transistor T1, so that the level of the pull-up node PU can be stored. And in a case where the first transistor T1 is turned on for output, the level of the pull-up node PU can be further pulled up by the bootstrap effect of the storage capacitor C1, to improve the output performance.

During the operation of the gate drive circuit, in a case where the gate scanning signal G(n-1) is at a high level, the fourth transistor T4 is turned on, the pull-up node PU is charged, and the raised level of the pull-up node PU allows the first transistor T1 to be turned on, so that the first clock signal CLK1 can be output at the output terminal through the first transistor T1, that is, the gate scanning signal Gn is identical to the first clock signal CLK1. In a case where the first clock signal CLK1 is at a high level, the gate scanning signal Gn also outputs at a high level. In a case where the gate scanning signal Gn is at a high level, the shift register unit of the GOA gate drive circuit 11 inputs the high level signal Gn to a corresponding row of gate line 105A of the array substrate, so that the first gate electrode 1041 of the first thin film transistor 104 in each of the sub-pixel units corresponding to the gate line 105A is applied with the high level signal Gn, so as to allow all of these first thin film transistors 104 to be turned on. The data signal is input to the liquid crystal capacitor C2 in the corresponding sub-pixel unit through the first thin film transistor 104 in each sub-pixel to charge the liquid crystal capacitor C2 in the corresponding sub-pixel unit, so as to implement inputting and holding the signal voltage of the sub-pixel unit. In a case where the gate scanning signal G(n+1) is at a high level, the second driving transistor T2 and the third driving transistor T3 are turned on, achieving the effect of resetting the pull-up node PU and pulling down the level at the output terminal. In this way, for example, the driving function of scanning the array substrate 100 row by row can be achieved by the GOA gate drive circuit 11.

Because the source electrode and the drain electrode of each of the above transistors are symmetrical, the source electrode and the drain electrode of each transistor can be exchanged. The first electrode can be, for example, a source electrode or a drain electrode, and the second electrode can be, for example, a drain electrode or a source electrode. The source electrode and the drain electrode of the thin film transistor are collectively referred to as "a source-drain electrode" in the present disclosure, and are distinguished by a first source-drain electrode and a second source-drain electrode. For example, each of the above transistors may be an N-type transistor. Each of the above transistors is not limited to the N-type transistor, and at least part of the above transistors may be P-type transistors. So, the polarity of the corresponding turn-on signal STV and the scanning signal that is output can be changed accordingly.

It is to be noted that, in each of the embodiments of the present disclosure, the structure of the shift register unit of the GOA gate drive circuit 11 is not limited to the above-described structure, and the shift register unit of the GOA gate drive circuit 11 may be any suitable structure. The structure may also include more or less transistors and/or capacitors, and for example, may comprise sub-circuits for implementing functions, such as pull-up node control, pull-down node control, noise reduction, etc., and the embodiments of the present disclosure are not limited in this aspect.

For example, as illustrated in FIG. 1A and FIG. 1B, the first thin film transistor 104 includes structures, such as a first gate electrode 1041, a first active layer 1042, a first source-drain electrode 1043, and a second source-drain electrode 1044; and the second thin film transistor 103 includes structures, such as a second gate electrode 1031, a second active layer 1032, a first source-drain electrode 1033, and a second source-drain electrode 1034. For example, the first source-drain electrode 1043 of the first thin film transistor 104 may be a source electrode or a drain electrode, and accordingly the second source-drain electrode 1044 of the first thin film transistor 104 may be a drain electrode or a source electrode; and the first source-drain electrode 1033 of the second thin film transistor 103 may be a source electrode or a drain electrode, and accordingly the second source-drain electrode 1034 of the second thin film transistor 103 may be a drain electrode or a source electrode. For example, the second gate electrode 1031 is electrically connected to a circuit portion (not shown) constituting the pull-up node in the shift register unit of the gate drive circuit, to implement the control of the second thin film transistor 103.

For clarity, FIG. 1A and FIG. 1B only illustrate a portion of the pixel electrode 107 and a portion of the common electrode 109 for schematic description. For example, the pixel electrode 107 is a comb-pattern electrode and may cover the pixel region of the entire sub-pixel unit, the common electrode 109 may also be a comb-pattern electrode and may cover the pixel region of the entire sub-pixel. For example, the comb portion of the pixel electrode 107 and the comb portion of the common electrode 109 may overlap with each other or intersect with each other in a direction parallel to the surface of the array substrate 100. The common electrode 109 can be connected, for example, to a common electrode line to receive a common voltage. Moreover, in the present embodiment, the common electrode 109 can also be used as a touch electrode (self-capacitance electrode) of the touch operation. For example, the touch wire 106 can also be used as the common electrode line. The common electrode 109 may also use a plate structure and may have via holes at required positions to facilitate electrical connection between the pixel electrode and the thin film transistor, or to facilitate electrical connection between the common electrode and the touch wire.

For example, as illustrated in FIG. 1A and FIG. 1B, in the embodiments of the present disclosure, a case where the pixel electrode 107 is located on a side of the common electrode 109 away from the base substrate 101 is described as an example, but the embodiments of the present disclosure are not limited in this aspect.

Figure 1C:
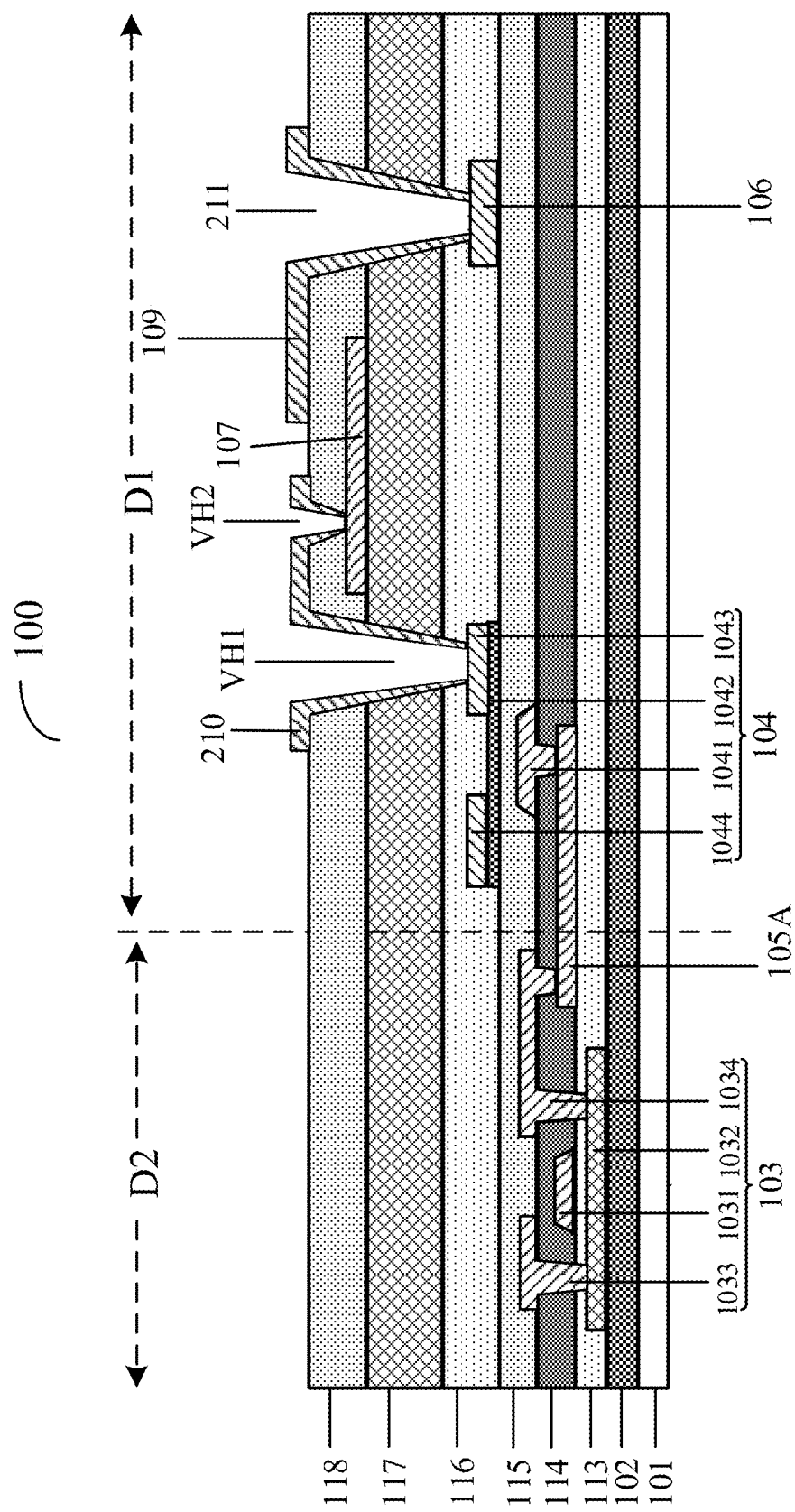
FIG. 1C is a schematically structural cross-section view provided by another embodiment of the present disclosure.

For example, as illustrated in FIG. 1C, the pixel electrode 107 may be first formed on the base substrate 101, and after the second passivation layer 118 is formed, the via hole VH2 exposing the pixel electrode 107 and the via hole VH1 exposing the first source-drain electrode 1043 of the first thin film transistor 104 may be formed. When the common electrode 109 is formed, the fourth connection electrode 210 is simultaneously formed to allow the pixel electrode 107 and the first source-drain electrode 1043 of the first thin film transistor 104 to be electrically connected. The fourth connection electrode 210 is electrically connected to the pixel electrode 107 and the first source-drain electrode 1043 of the first thin film transistor 104 through the via hole VH1 and the via hole VH2, respectively. The common electrode 109 is electrically connected to the touch wire 106 through the via hole 211. For example, the fourth connection electrode 210 and the common electrode 109 are insulated from each other.

In the embodiments of the present disclosure, the common electrode can be as a first display electrode, and the pixel electrode can be as a second display electrode.

For example, the first active layer 1042 of the first thin film transistor 104 includes an oxide semiconductor or an organic semiconductor material, and the second active layer 1032 of the second thin film transistor 103 includes a poly-silicon semiconductor material. For example, the oxide semiconductor material includes a metal oxide semiconductor material (for example, indium gallium zinc oxide (IGZO)), which is not specifically limited in the embodiments of the present disclosure; and the poly-silicon semiconductor material includes a low temperature poly-silicon semiconductor material, a high temperature poly-silicon semiconductor material, or the like, which is not specifically limited in the embodiments of the present disclosure.

For example, as illustrated in FIG. 1A and FIG. 1B, the array substrate 100 further includes a base substrate 101 and an interlayer insulating layer 114 on the base substrate 101, and the first thin film transistor 104 and the second thin film transistor 103 are formed in different layers on the base substrate 101. The base substrate 101 may be a glass substrate, a quartz substrate, a plastic substrate, or a substrate of other suitable material. The material of the interlayer insulating layer 114 may include SiNx, SiOx, or other suitable material, and the embodiments of the present disclosure are not limited in this aspect.

For example, as illustrated in FIG. 1A and FIG. 1B, with respect to the base substrate 101, the first gate electrode 1041 of the first thin film transistor 104 and the first active layer 1042 of the first thin film transistor 104 are both formed on the interlayer insulating layer 114, and the second gate electrode 1031 of the second thin film transistor 103 and the second active layer 1032 of the second thin film transistor 103 are both formed between the interlayer insulating layer 114 and the base substrate 101. For example, the second source-drain electrode 1034 of the second thin film transistor 103 is electrically connected to the first gate electrode 1041 of the first thin film transistor 104, and the first source-drain electrode 1033 of the second thin film transistor 103, the second source-drain electrode 1034 of the second thin film transistor 103, and the first gate electrode 1041 of the first thin film transistor 104 are formed in a same layer. For example, as illustrated in FIG. 1A and FIG. 1B, the second source-drain electrode 1034 of the second thin film transistor 103 is electrically connected to the first gate electrode 1041 of the first thin film transistor 104 through the gate line 105A, and the gate line 105A and the second gate electrode 1031 are formed in a same layer. For example, the materials of the first gate electrode 1041, the first source-drain electrode 1043 and the second source-drain electrode 1044 of the first thin film transistor 104, the gate line 105A, the second gate electrode 1031, and the first source-drain electrode 1033 and the second source-drain electrode 1034 of the second thin film transistor 103 may include aluminum, aluminum alloy, copper, copper alloy, or any other suitable materials, and the embodiments of the present disclosure are not limited in this aspect. For example, as illustrated in FIG. 1A and FIG. 1B, the second source-drain electrode 1044 of the first thin film transistor 104 and the data line 105B are electrically connected or integrally formed with each other, and for example, the second source-drain electrode 1044 is a portion of the data line 105B. For example, as illustrated in FIG. 1A and FIG. 1B, the second gate electrode 1031 and the gate line 105A are insulated from each other.

For example, as illustrated in FIG. 1A and FIG. 1B, in an example, the first thin film transistor 104 may be, for example, a bottom-gate back-channel-etching structure, or may be of other types, such as a bottom-gate channel-etching-barrier structure. For example, in the bottom-gate thin film transistor structure, in a case where external light (for example, light provided by the backlight source) is irradiated from one side of the base substrate 101 to the first thin film transistor 104, the opaque first gate electrode 1041 of the first thin film transistor 104 can shield part of the light, to prevent the light from irradiating onto the first active layer 1042 to a certain extent to generate an undesired leakage current. In addition, in the manufacturing process, the first active layer 1042 of the first thin film transistor 104 of the back-channel-etching structure can be formed by only one photolithography process, which can improve the size precision of the channel to a certain extent and facilitate the implementation of device miniaturization.

For example, as illustrated in FIG. 1A and FIG. 1B, the array substrate 100 further includes a first passivation layer 116 on the interlayer insulating layer 114, and a planarization layer 117 and a second passivation layer 118 on the first passivation layer 116. As illustrated in FIG. 1B, the array substrate 100 includes a first via hole 110, a second via hole 111, and a third via hole 112. The first via hole 110 is formed in the second passivation layer 118, the planarization layer 117, and the first passivation layer 116, and to expose at least a portion of the first source-drain electrode 1043, the second via hole 111 is formed in the second passivation layer 118, the planarization layer 117, and the first passivation layer 116, and to expose at least a portion of the touch wire 106 (mentioned in the following description), and the third via hole 112 is formed in the second passivation layer 118 to expose at least a portion of the common electrode 109. The materials for the first passivation layer 116 and the second passivation layer 118 include inorganic insulating materials (such as SiNx, SiOx), organic insulating materials (such as organic resins), or other suitable materials, and the embodiments of the present disclosure are not limited in this aspect. For example, in other examples, the planarization layer 117 may not be provided. In this case, the first via hole 110 is formed in the second passivation layer 118 and the first passivation layer 116, and the second via hole 111 is formed in the second passivation layer 118 and the first passivation layer 116.

For example, as illustrated in FIG. 1A and FIG. 1B, the pixel region of the array substrate 100 further includes the pixel electrode 107 and the common electrode 109. The pixel electrode 107 and the common electrode 109 are insulated from each other, and can be respectively applied with signals to form an electric field, and to drive the deflection of liquid crystal molecules. For example, the array substrate 100 including the pixel electrode 107 and the common electrode 109 is formed as a horizontal-electric-field-type array substrate. For example, the pixel electrode 107 and the common electrode 109 in the pixel region may constitute the liquid crystal capacitor C2 (pixel capacitor). The common electrode 109 is formed on the first passivation layer 116, and the second passivation layer 118 covers the common electrode 109. The pixel electrode 107 is formed on the second passivation layer 118, and the pixel electrode 107 is electrically connected to the first source-drain electrode 1043 of the first thin film transistor 104 through the first via hole 110 in the first passivation layer 116 and the second passivation layer 118. Examples for the material of the pixel electrode 107 include aluminum, aluminum alloy, copper, copper alloy, molybdenum, molybdenum alloy, titanium, titanium alloy, ITO, IZO, or other suitable materials, and the embodiments of the present disclosure are not limited in this aspect. Examples for the material of the common electrode 109 includes aluminum, aluminum alloy, copper, copper alloy, ITO, IZO, or other suitable materials, and the embodiments of the present disclosure are not limited in this aspect.

For example, as illustrated in FIG. 1A and FIG. 1B, the display area D1 of the array substrate 100 further includes the touch wire 106 and the first connection electrode 108, and the touch wire 106, the first source-drain electrode 1043 of the first thin film transistor 104, and the second source-drain electrode 1044 of the first thin film transistor 104 are formed in a same layer. For example, in one embodiment, a case where the touch wire 106, the first source-drain electrode 1043 of the first thin film transistor 104, and the second source-drain electrode 1044 of the first thin film transistor 104 are formed in a same layer refers to the same metal layer being patterned to form the touch wire 106, the first source-drain electrode 1043 and the second source-drain electrode 1044. The position of the touch wire 106 includes but is not limited thereto. For example, in another example, the touch wire 106, the first source-drain electrode 1033 of the second thin film transistor 103, and the second source-drain electrode 1034 of the second thin film transistor 103 may be formed in a same layer. Examples for the material of the touch wire 106 include aluminum, aluminum alloy, copper, copper alloy, or other suitable materials, and the embodiments of the present disclosure are not limited in this aspect. For example, on the array substrate, the touch wire 106 and the data line 105B extend in parallel.

The first connection electrode 108 and the pixel electrode 107 are formed in a same layer, and the first connection electrode 108 electrically connects the touch wire 106 to the common electrode 109 through the second via hole 111 and the third via hole 112. For example, as illustrated in FIG. 1B, the first connection electrode 108 and the pixel electrode 107 are insulated from each other. For example, in an example, the common electrode 109 is driven by a time-sharing mode (i.e., the display phase and the touch phase are driven separately). During the display phase, the common electrode 109 is applied with the common voltage, and cooperates with the pixel electrode 107 to implement a display operation; and during the touch phase, the common electrode 109 is also used as the touch electrode (for example, a self-capacitance touch electrode), and the touch chip (not shown) can detect the change of the capacitance of the touch electrode by the touch wire 106, so that the touch operation can be detected. In a case where the common electrode 109 is also used as the touch electrode, for example, in a case where the finger touches the display panel including the array substrate, the capacitance value of the common electrode 109 at the position corresponding to the finger changes, and the touch detecting circuit can calculate the position of the touch point based on the change of the capacitance value at the position of the touch point, and detect the touch operation. The touch wire 106 is electrically connected to the common electrode 109 through the first connection electrode 108, which avoids forming a via hole between the common electrode 109 and the touch wire 106 to allow the common electrode 109 and the touch wire 106 to be directly in electrical connection, which saves a mask process. The material of the first connection electrode 108 may, for example, be the same as the material of the pixel electrode 107. In a case where the common electrode 109 is not simultaneously used as the touch electrode, the touch wire 106 may also be the common electrode line, so as to apply the display signal to the common electrode 109 through the common electrode line.

For example, as illustrated in FIG. 1A and FIG. 1B, the array substrate 100 may further include a buffer layer 102, a first insulating layer 113, a second insulating layer 115, or the like.

The buffer layer 102 is provided, for example, on the base substrate 101. In one hand, the buffer layer 102 can prevent impurity ions in the base substrate 101 from diffusing into circuit layers including the first thin film transistor 104 and the second thin film transistor 103 which are formed later, and can prevent bringing bad effect to the characteristics, such as the threshold voltage, and leakage current, of components of the first thin film transistor 104 and the second thin film transistor 103. In addition, the buffer layer 102 can also planarize the surface of the base substrate 101. Examples of the material of the buffer layer 102 include SiNx, SiOx, or other suitable materials, which is not specifically limited in the embodiments of the present disclosure.

For example, the first insulating layer 113 is disposed on the buffer layer 102 and covers the second active layer 1032 as the gate insulating layer of the second thin film transistor 103. Examples for the material of the first insulating layer 113 include SiNx, SiOx, or other suitable materials, which is not specifically limited in the embodiments of the present disclosure.

For example, the second insulating layer 115 is disposed on the interlayer insulating layer 114 and covers the first source-drain electrode 1033, the second source-drain electrode 1034, and the first gate electrode 1041, which acts as the gate insulating layer of the first thin film transistor 104. Examples for the material of the second insulating layer 115 include SiNx, SiOx, or other suitable materials, which is not specifically limited in the embodiments of the present disclosure.

For example, the planarization layer 117 is disposed between the first passivation layer 116 and the second passivation layer 118, and both the first via hole 110 and the second via hole 111 are through the planarization layer 117. Examples for the material of the planarization layer 117 include SiNx, SiOx, or other suitable materials, which is not specifically limited in the embodiments of the present disclosure.

Figure 3:
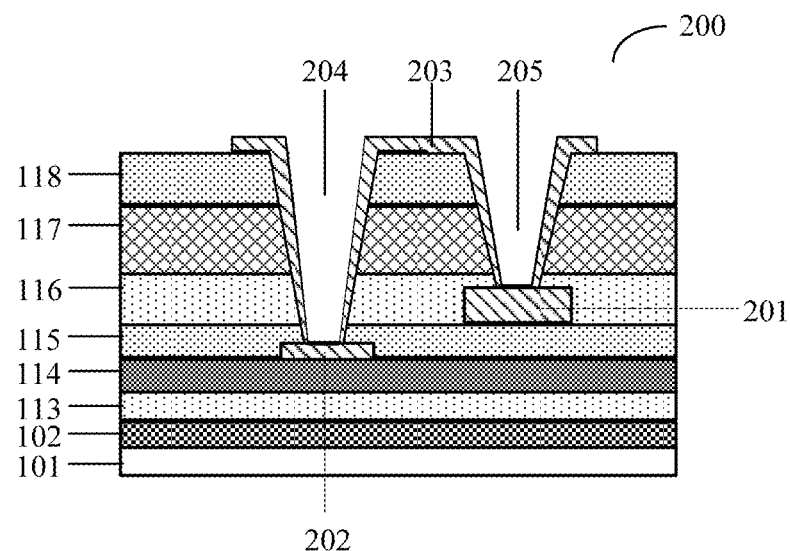
FIG. 3 is a schematic diagram of a partial cross-sectional structure of an array substrate provided by an embodiment of the present disclosure.

For example, as illustrated in FIG. 3, the array substrate 100 may further include a connection region 200. FIG. 3 is a schematic diagram of a cross-sectional structure of the connection region 200. The connection region 200 is located in the peripheral area D2 of the array substrate 100. For example, the connection region 200 includes structures, such as the first electrode 201, the second electrode 202, the second connection electrode 203, etc. For example, the first electrode 201 is an extending portion of the data line or the touch wire, or is electrically connected to the data line or the touch wire, and the second electrode 202 is a portion of the peripheral wire. In this way, the data line or the touch wire can be connected to the peripheral wire by the connection region, and the peripheral wire extends, for example, to the bonding region to be electrically connected to the driver chip which is bonded, or to be connected to the multiplex circuit unit. The second connection electrode 203 can act as an electrical connection, and can further prevent the first electrode 201 and the second electrode 202 from being exposed to be easily oxidized.

Referring to FIG. 1B and FIG. 3, the first electrode 201, the first source-drain electrode 1043 of the first thin film transistor 104, and the second source-drain electrode 1044 of the first thin film transistor 104 are in a same layer, and the material of the first electrode 201 may be the same as the material of the first source-drain electrode 1043 and the material of the second source-drain electrode 1044 of the first thin film transistor 104. The second electrode 202, the first source-drain electrode 1033 of the second thin film transistor 103, and the second source-drain electrode 1034 of the second thin film transistor 103 are in a same layer, and the material of the second electrode 202 may be the same as the material of the first source-drain electrode 1033 and the material of the second source-drain electrode 1034 of the second thin film transistor 103. The second connection electrode 203 and the pixel electrode 107 are in a same layer, and the second connection electrode 203 electrically connects the first electrode 201 to the second electrode 202 through the fourth via hole 204 and the fifth via hole 205. The material of the second connection electrode 203 may be the same as the material of the pixel electrode 107. For example, the fourth via hole 204, the fifth via hole 205 and the second passivation layer 118 may be formed by a same mask. As illustrated in FIG. 3, the fourth via hole 204 is through from the second passivation layer 118 to the second insulating layer 115 and exposes at least a portion of the surface of the second electrode 202, and the second connection electrode 203 is electrically connected to the second electrode 202 through the fourth via hole 204. The fifth via hole 205 is through from the second passivation layer 118 to the first passivation layer 116 and exposes at least a portion of the surface of the first electrode 201, and the second connection electrode 203 is electrically connected to the first electrode 201 through the fifth via hole 205. For example, the first electrode 201 and the second electrode 202 are electrically connected by the second connection electrode 203, which avoids forming a via hole in the second insulating layer 115 to allow the first electrode 201 and the second electrode 202 to be electrically connected directly, and saves a mask process and reduces the production cost.

For example, the connection region 200 may be a connecting circuit of the array substrate 100 and allows wires in the peripheral area D2 and data lines in the display area D1 to be electrically connected, and the connection region 200 may also be used for the circuit unit, such as a multiplex (MUX) circuit unit, and a fan-out region, in the peripheral area D2 of the array substrate 100. For example, the MUX circuit unit can divide a driving signal of the driver IC of the array substrate 100 into a plurality of signals and apply the plurality of signals to a plurality of signal lines (for example, touch wires), which can decrease the amount of peripheral wires in the peripheral area. The peripheral wires in the fan-out region can be connected to the corresponding data driver IC and the touch driver IC through the bonding region.

Figure 4:
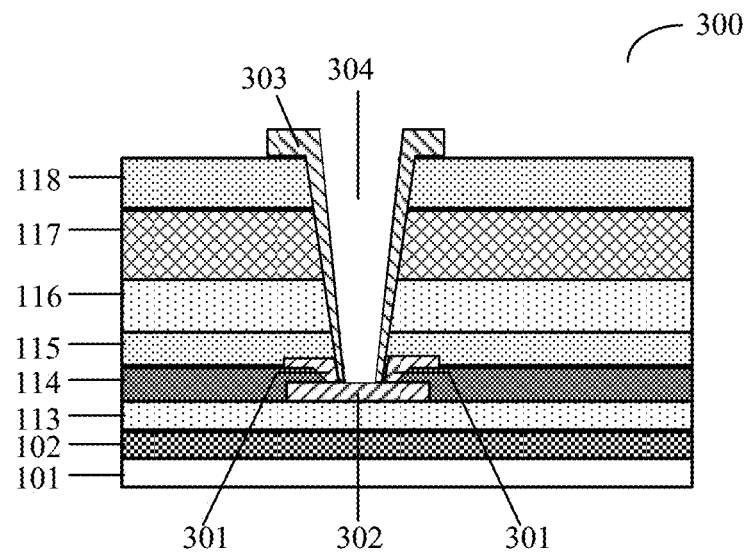
FIG. 4 is a schematic diagram of a partial cross-sectional structure of an array substrate provided by another embodiment of the present disclosure.

For example, as illustrated in FIG. 4, the array substrate 100 may further include a bonding region 300. FIG. 4 is a schematic diagram of a cross-sectional structure of the bonding region 300. The bonding region 300 is located in the peripheral area D2 of the array substrate 100. For example, the bonding region (bonding electrode) 300 includes structures, such as the fourth electrode 301, the fifth electrode 302, and the third connection electrode 303, etc. The fourth electrode 301 is a portion of the peripheral wire, and for example, is electrically connected to the second electrode 202 in the connection region 200. The fifth electrode 302 is electrically connected to the fourth electrode 301 so that the resistance of the bonding region can be reduced. The third connection electrode 303 can act as a connection, and can prevent the fifth electrode 302 and the fourth electrode 301 from being exposed to be easily oxidized.

Referring to FIG. 1B and FIG. 4, the fourth electrode 301, the first source-drain electrode 1033 of the second thin film transistor 103, and the second source-drain electrode 1034 of the second thin film transistor 103 are in a same layer, and the material of the fourth electrode 301 may be the same as the material of the first source-drain electrode 1033 and the second source-drain electrode 1034 of the second thin film transistor 103. The fifth electrode 302 and the second gate electrode 1031 of the second thin film transistor 103 are in a same layer, and the material of the fifth electrode 302 can be the same as the material of the second gate electrode 1031 of the second thin film transistor 103. The third connection electrode 303 and the pixel electrode 107 are in a same layer, and the material of the third connection electrode 303 may be the same as the material of the pixel electrode 107. As illustrated in FIG. 4, the fourth electrode 301, the fifth electrode 302, and the third connection electrode 303 are electrically connected to each other through the sixth via hole 304. For example, the sixth via hole 304 is through from the second passivation layer 118 to the interlayer insulating layer 114 and exposes at least a portion of the surface of the fifth electrode 302. The sixth via hole 304 may also be through from the second passivation layer 118 to the second insulating layer 115 to expose at least a portion of the surface of the fourth electrode 301. The arrangement of the sixth via hole 304 is not limited to the above description as long as the fourth electrode 301, the fifth electrode 302, and the third connection electrode 303 can be electrically connected to each other.

For example, in an example, the bonding region 300 may be a connecting circuit that allows the data driver IC and the touch IC mounted in the peripheral area D2 of the array substrate 100 to be respectively electrically connected to the data lines and touch wires extending from the display area D1. The third connection electrode 303 may be electrically connected to pins of the driver IC (data driver IC or touch IC) mounted on the array substrate 100 or pins of the flexible printed circuit (FPC) comprising the driver chip by the anisotropic conductive adhesive (ACA). Because the third connection electrode 303 is electrically connected to the fourth electrode 301 or the fifth electrode 302, the driver IC can be electrically connected to the data lines or the touch wires in the display area, and the driver IC can load the driving signals into the display area D1.

Figure 5A:
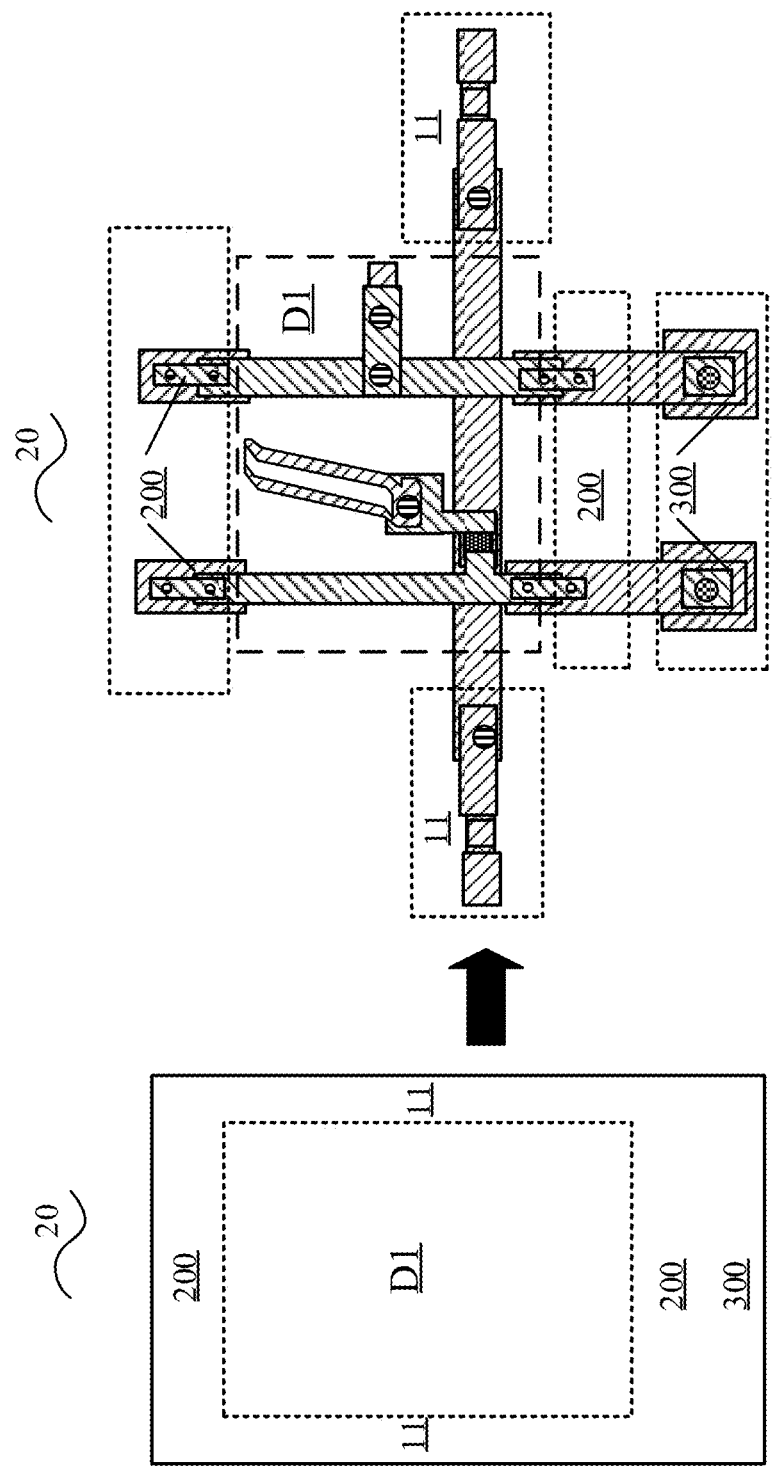
FIG. 5A is a schematically structural plan diagram of an array substrate provided by another embodiment of the present disclosure (the left side is a regional schematic diagram, and the right side is a top view of a partial structure of the array substrate)

FIG. 5A is a schematic diagram of another planar structure of the array substrate 20 provided by the embodiments of the present disclosure. As illustrated in FIG. 5A, the array substrate 20 includes a display area D1 and a peripheral area D2 surrounding the display area D1. The peripheral area D2 includes a GOA gate drive circuit 11, a connection region 200, a bonding region 300, etc. In FIG. 5A, the gate drive circuit 11 is provided on both sides of the display area D1 to realize double-sided driving, but the present disclosure is not limited thereto.

For example, two bonding regions 300 are shown as an example in FIG. 5A. One bonding region 300 is electrically connected to data lines 105B in the display area D1 by the connection region 200 for bonding with the data driver IC, and another bonding region 300 is electrically connected to touch wires 106 in the display area D1 by the connection region 200 for bonding with the touch IC. In other examples, the data driver IC and the touch IC can be formed in a same integrated chip, so that the above two bonding regions 300 can be bonded with the integrated chip.

Combined FIG. 1B, FIG. 2, and FIG. 5A, in a case where the second source-drain electrode 1034 of the second thin film transistor 103 of the GOA gate drive circuit 11 provides a high level signal to the first gate electrode 1041 of the first thin film transistor 104 of the display area D1 by the gate line 105, the first gate electrode 1041 of the first thin film transistor 104 is in a turned-on state, and the data signal is input to the first thin film transistor 104 by either of the bonding regions 300, allowing the pixel electrode 107 to be charged, so that the signal can be input and kept in the sub-pixel unit including the pixel electrode 107. The touch signal is loaded to the touch wire 106 by another bonding region 300 to implement the touch detecting function of the array substrate 20. The other structures and functions of the array substrate 20 can refer to structures and functions of a conventional array substrate, and details are not repeated herein.

In an embodiment of the present disclosure, FIG. 1A, FIG. 1B, FIG. 3, FIG. 4, and FIG. 5B can be combined to obtain relative positions and connection relationships between the various components.

It is to be noted that, for clarity, the entire structure of the array substrate 100 is not shown in the accompany drawings. In order to implement the necessary functions of the array substrate, those skilled in the art can arrange other structures (not shown) according to specific application scenarios, and the embodiments of the present disclosure are not limited in this aspect.

In the array substrate provided by at least one embodiment of the present disclosure, thin film transistors of different material types are disposed in the display area D1 and the peripheral area D2 of the array substrate, respectively. For example, according to requirements, the first thin film transistor 104 in the display area D1 may be an oxide thin film transistor, the second thin film transistor 103 in the peripheral area D2 may be a poly-silicon thin film transistor, and the second thin film transistor 103 may be, for example, a thin film transistor of the signal output terminal of the GOA gate drive circuit 11. The second source-drain electrode 1034 of the second thin film transistor 103 is electrically connected to the first gate electrode 1041 of the first thin film transistor 104 by the gate line 105A, and the turn-on state and the turn-off state of the first thin film transistor 104 can be controlled by controlling the value of the output voltage of the second thin film transistor 103. In this way, the function of scanning the array substrate row by row can be implemented.

In one hand, the first thin film transistor 104 in the display area D1 of the array substrate is an oxide thin film transistor. Because the oxide thin film transistor has characteristics of high mobility, good stability, good electrical uniformity, low off-state leakage current, etc., the contrast ratio of the display area of the display device including the array substrate 100 including the first thin film transistor 104 can be improved, the power consumption of the display device can be reduced, and the display quality of the display device can be improved.

In addition, the touch wire 106 is electrically connected to the common electrode 109 by the first connection electrode 108, which can avoid forming a via hole in the planarization layer 117 to allow the touch wire 106 and the common electrode 109 to be directly connected electrically. The connection electrode 203 electrically connects the first electrode 201 and the second electrode 202, which can avoid forming a via hole in the second insulating layer 115 to allow the first electrode 201 and the second electrode 202 to be directly connected electrically. By providing the first connection electrode 108 and the second connection electrode 203, the mask process can be saved and the production cost can be reduced.

Furthermore, the touch wire 106, the first source-drain electrode 1043 of the first thin film transistor 104, and the second source-drain electrode 1044 of the first thin film transistor 104 are disposed in a same layer, the first connection electrode 108 and the pixel electrode 107 are disposed in a same layer, and the first gate electrode 1041 of the first film transistor 104, the first source-drain electrode 1033 of the second thin film transistor 103, and the second source-drain electrode 1034 of the second thin film transistor 103 are disposed in a same layer. These layer structures can further save the mask process and reduce the production cost.

Another embodiment of the present disclosure provides an array substrate used in an organic light-emitting diode display device. The array substrate includes a first thin film transistor in a display area D1 and a second thin film transistor 103 in a peripheral area D2. Compared with the array substrate used in the liquid crystal display device as illustrated in FIG. 1A and FIG. 1B, the difference is that the first thin film transistor as the switching component of the sub-pixel unit is not directly connected to the pixel electrode. The sub-pixel unit further includes a driving transistor, a storage capacitor, etc. For example, the source electrode or the drain electrode of the first thin film transistor, is connected to the gate electrode of the driving transistor and one electrode of the storage capacitor, so as to input the data signal to the gate electrode of the driving transistor and store the data signal in the storage capacitor. The source electrode or the drain electrode of the driving transistor is connected to the pixel electrode, and the pixel electrode acts as an anode or a cathode of the organic light-emitting diode, so that the driving current can be applied to the organic light-emitting diode. For example, structures, such as a light-emitting layer, a pair of electrodes, a pixel definition layer, etc. of the organic light-emitting diode may be formed on the pixel electrode.

Another embodiment of the present disclosure provides an array substrate used in an electronic paper display device. The array substrate includes a first thin film transistor in a display area D1 and a second thin film transistor 103 in a peripheral area D2. Compared with the array substrate used in the liquid crystal display device as illustrated in FIG. 1A and FIG. 1B, the difference is that the sub-pixel region may not include the common electrode and the touch wire.

For example, an embodiment of the present disclosure also provides a display panel, and the display panel includes any one of the array substrates described in the above embodiments.

The display panel may be, for example, a liquid crystal display panel, an organic light-emitting diode display panel, or an electronic paper display panel.

The liquid crystal display panel may be, for example, an amorphous silicon liquid crystal display panel or a poly-silicon liquid crystal display panel (for example, a low temperature poly-silicon liquid crystal display panel or a high temperature poly-silicon liquid crystal display panel). The present examples do not specifically limit the type of the display panel. In the liquid crystal display panel, the array substrate and the opposite substrate are opposed to each other to form a liquid crystal cell, and the liquid crystal cell is filled with liquid crystal material. The opposite substrate is, for example, a color filter substrate. The pixel electrode of each sub-pixel unit of the array substrate is used to apply the electric field to control the extent of deflection of the liquid crystal material, so as to implement the display operation. The liquid crystal display panel also includes a backlight source that provides the backlight for display if needed.

In the organic light-emitting diode (OLED) display panel, the array substrate may be covered with a packaging substrate to seal the components, such as organic light-emitting diodes formed on the array substrate.

In the electronic paper display panel, an electronic ink layer is further formed on the array substrate, and the pixel electrode of each sub-pixel unit applies a voltage for driving the charged micro-particles in the electronic ink to move to perform the display operation. The technical effects of the display panel can refer to the technical effects of the array substrate described in the above embodiments, and details are not repeated herein.

For example, an embodiment of the present disclosure also provides an electronic device, and the electronic device includes any one of the display panels described in the above embodiments. The electronic device can be, for example, any suitable product or component such as a tablet computer, a notebook computer, a video camera, a navigator, or the like. The technical effects of the electronic device can refer to the technical effects of the array substrate described in the above embodiments, and details are not repeated herein again.

At least an embodiment of the present disclosure also provides a method of manufacturing an array substrate, and the manufacturing method is applicable to any one of the array substrates described in the above embodiments. FIG. 6A-FIG. 6G are schematic diagrams of cross-sectional structures of an array substrate during a manufacturing process provided by an embodiment of the present disclosure.

Figure 6A:
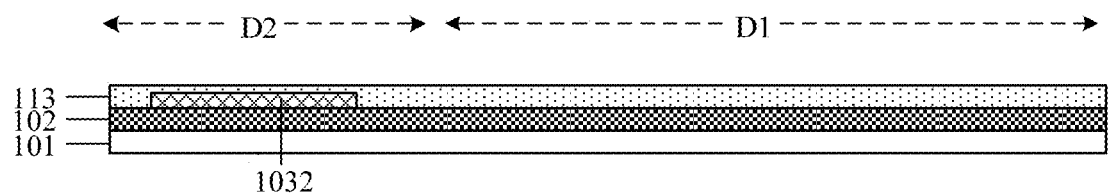
FIG. 6A-FIG. 6G are schematically structural cross-sectional views of an array substrate during a manufacturing process provided by an embodiment of the present disclosure.

As illustrated in FIG. 6A, the base substrate 101 is first provided. The base substrate 101 may be, for example, a glass substrate, a quartz substrate, a plastic substrate, or a substrate of other suitable material, which is not specifically limited in the embodiments of the present disclosure.

As illustrated in FIG. 6A, the buffer layer 102 may be deposited on the base substrate 101 by, for example, chemical vapor deposition, physical vapor deposition or the like. The buffer layer 102 can prevent, for example, impurity ions in the base substrate 101 from diffusing into circuit layers, such as thin film transistors, which are formed in the subsequent process, which can prevent the effect on the characteristics, such as the threshold voltage, and leakage current, of thin film transistor components. The buffer layer 102 can also, for example, planarize the surface of the base substrate 101. Examples for the material of the buffer layer 102 include $SiN_x$, $SiO_x$, or other suitable materials, and the embodiments of the present disclosure are not limited in this aspect.

As illustrated in FIG. 6A, the second active layer 1032 is formed on the buffer layer 102 by a first mask process. For example, the first mask process includes: depositing an active layer thin film on the buffer layer 102 and patterning the active layer thin film by, for example, a photolithography process to form the second active layer 1032 in the peripheral area D2 of the array substrate. For example, forming the second active layer 1032 by the photolithography process includes: after depositing the active layer thin film on the buffer layer 102, forming a photoresist layer (not shown) on the entire surface of the active layer thin film. The photoresist layer is patterned by the photolithography process including an exposure process and a developing process, so as to form a photoresist pattern having a shape corresponding to a desired shape of the second active layer 1032 on the active layer thin film. The active layer thin film is then patterned (e.g., by an etching process) by using the above photoresist pattern as an etching mask to form the second active layer 1032 on the buffer layer 102. Finally, the photoresist pattern can be stripped off. The mask process described below also includes process steps of exposure, developing, etching, stripping off, etc., and the corresponding processes can refer to the conventional or known mask process. Details of the manufacturing method related to the mask process will not be repeated again in the embodiments of the present disclosure.

In an embodiment, the material of the second active layer 1032 includes any suitable material, such as amorphous silicon, or poly-silicon, which is not specifically limited in the embodiments of the present disclosure.

For example, in a case where the second active layer 1032 is formed by a poly-silicon material, the method of forming the poly-silicon second active layer 1032 may, for example, include: after depositing the amorphous silicon active layer thin film on the buffer layer 102, depositing the inducing metal by a sputtering process at a selected region on the amorphous silicon active layer thin film (usually at the region corresponding to the source/drain region which is formed in the subsequent process), and performing an annealing process, such as rapid thermal annealing (RTA), excimer laser annealing (ELA), or furnace annealing. During the annealing process, the region in which the amorphous silicon active layer thin film is in direct contact with the metal first occurs metal-induced crystallization (MIC) to form a MIC poly-silicon region, and then the poly-silicon grains are laterally grown into the amorphous silicon region which is not in direct contact with the metal, to form a poly-silicon region of metal-induced lateral crystallization (MILC). In this way, the amorphous silicon active layer thin film is crystallized into the poly-silicon active layer thin film. Then, the photoresist layer (not shown) is formed on the entire surface of the poly-silicon active layer thin film, and the photoresist layer is patterned by the photolithography process including the exposure process and the developing process, so as to form the photoresist pattern having the desired shape on the poly-silicon active layer thin film. The poly-silicon active layer thin film is then patterned by using the photoresist pattern as the etching mask to form the patterned poly-silicon second active layer 1032 on the buffer layer 102.

As illustrated in FIG. 6A, after forming the second active layer 1032, the first insulating layer 113 covering the second active layer 1032 can be formed, for example, by chemical vapor deposition, physical vapor deposition, or the like. Examples for the material of the first insulating layer 113 include SiNx, SiOx, or other suitable materials, and the embodiments of the present disclosure are not limited in this aspect.

Figure 6B:
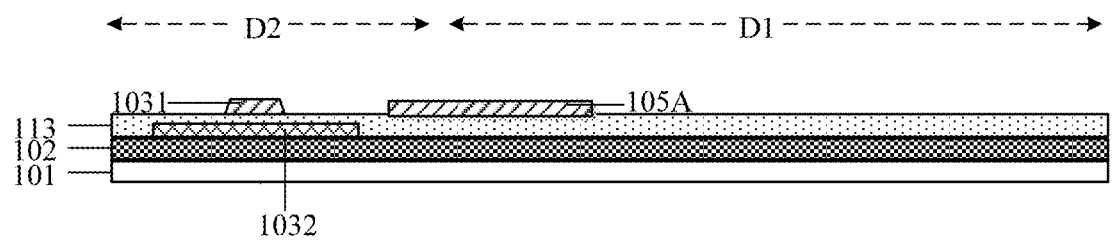

As illustrated in FIG. 6B, the second gate electrode 1031, the gate line(s) 105A, the fifth electrode 302 in the bonding region 300, and the like are formed on the first insulating layer 113 by a second mask process. The second gate electrode 1031 is located in the peripheral area D2 of the array substrate, and the gate line(s) 105A is/are in the peripheral area D2 and the display area D1 of the array substrate. Examples for the materials of the second gate electrode 1031 and the gate line(s) 105A include aluminum, aluminum alloy, copper, copper alloy, or any other suitable materials, and the embodiments of the present disclosure are not limited in this aspect.

Figure 6C:
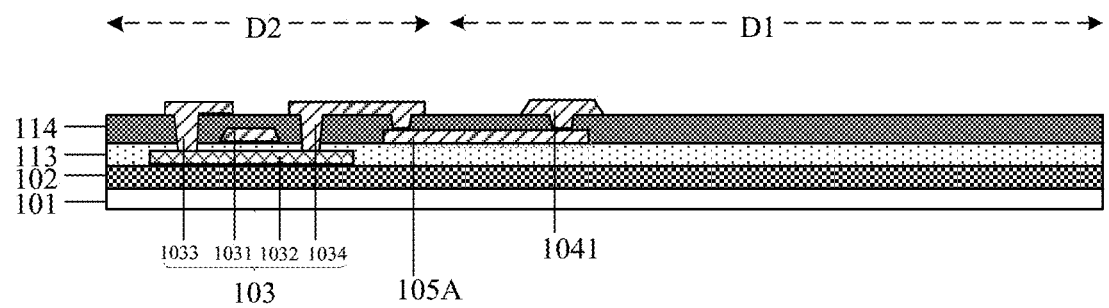

As illustrated in FIG. 6C, after the second gate electrode 1031, the gate line(s) 105A, and the fifth electrode 302 in the bonding region 300 are formed in the same layer, the interlayer insulating layer 114 covering the second gate electrode 1031 and the gate line(s) 105A can be formed by, for example, chemical vapor deposition, physical vapor deposition, or the like. The via holes which allow the first source-drain electrode 1033 and the second source-drain electrode 1034 of the second thin film transistor 103 to be electrically connected to the second active layer 1032 are formed in the interlayer insulating layer 114. For example, the interlayer insulating layer 114 can be formed by a third mask process. Examples for the material of the interlayer insulating layer 114 include SiNx, SiOx, or other suitable materials, and the embodiments of the present disclosure are not limited in this aspect.

As illustrated in FIG. 6C, for example, the first source-drain electrode 1033 and the second source-drain electrode 1034 of the second thin film transistor 103, the first gate electrode 1041, the second electrode 202 (peripheral wire) in the connection region 200, the fourth electrode 301 (peripheral wire) in the bonding region 300, or the like can be formed on the interlayer insulating layer 114 by the fourth mask process. The first source-drain electrode 1033 and the second source-drain electrode 1034 of the second thin film transistor 103 are disposed in the peripheral area D2 of the array substrate and are electrically connected to the second active layer 1032 through via holes. The first gate electrode 1041 is disposed in the display area D1 of the array substrate, and the first electrode 201 and the fourth electrode 301 which correspond to the same peripheral wire are electrically connected to each other. Examples for the materials of the first source-drain electrode 1033, the second source-drain electrode 1034 and the first gate electrode 1041 include aluminum, aluminum alloy, copper, copper alloy, or any other suitable materials, and the embodiments of the present disclosure are not limited in this aspect.

Figure 6D:
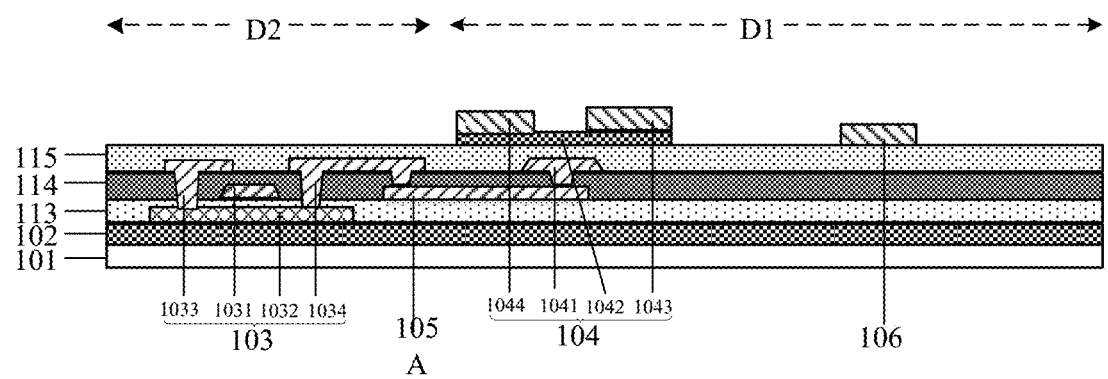

As illustrated in FIG. 6D, after the first source-drain electrode 1033 of the second thin film transistor 103, the second source-drain electrodes 1034 of the second thin film transistor 103, and the first gate electrode 1041 are formed, the second insulating layer 115 covering the first source-drain electrode 1033, the second source-drain electrode 1034, and the first gate electrode 1041 can be formed by chemical vapor deposition or physical vapor deposition, etc. Examples for the material of the second insulating layer 115 include SiNx, SiOx, or other suitable materials, and the embodiments of the present disclosure are not limited in this aspect.

As illustrated in FIG. 6D, after the second insulating layer 115 is formed, the first active layer 1042 is formed on the second insulating layer 115 by a fifth mask process. For example, the fifth mask process includes: depositing the active layer thin film on the second insulating layer 115, and patterning the active layer thin film by, for example, a photolithography process, to form the first active layer 1042 in the display area D1 of the array substrate. For example, the forming the first active layer 1042 by the photolithography process includes: forming a photoresist layer (not shown) on the entire surface of the active layer thin film after depositing the active layer thin film on the second insulating layer 115. The photoresist layer is patterned by the photolithography process including the exposure process and the developing process to form a photoresist pattern having a shape corresponding to a desired shape of the first active layer 1042 on the active layer thin film. The active layer thin film is then patterned by using the photoresist pattern as the etching mask to form the first active layer 1042 on the second insulating layer 115. For example, the material of the second active layer 1032 includes an oxide semiconductor, an organic semiconductor, or the like, and the oxide semiconductor material includes a metal oxide semiconductor material (e.g., indium gallium zinc oxide (IGZO)), which is not specifically limited in the embodiments of the present disclosure.

Figure 5B:
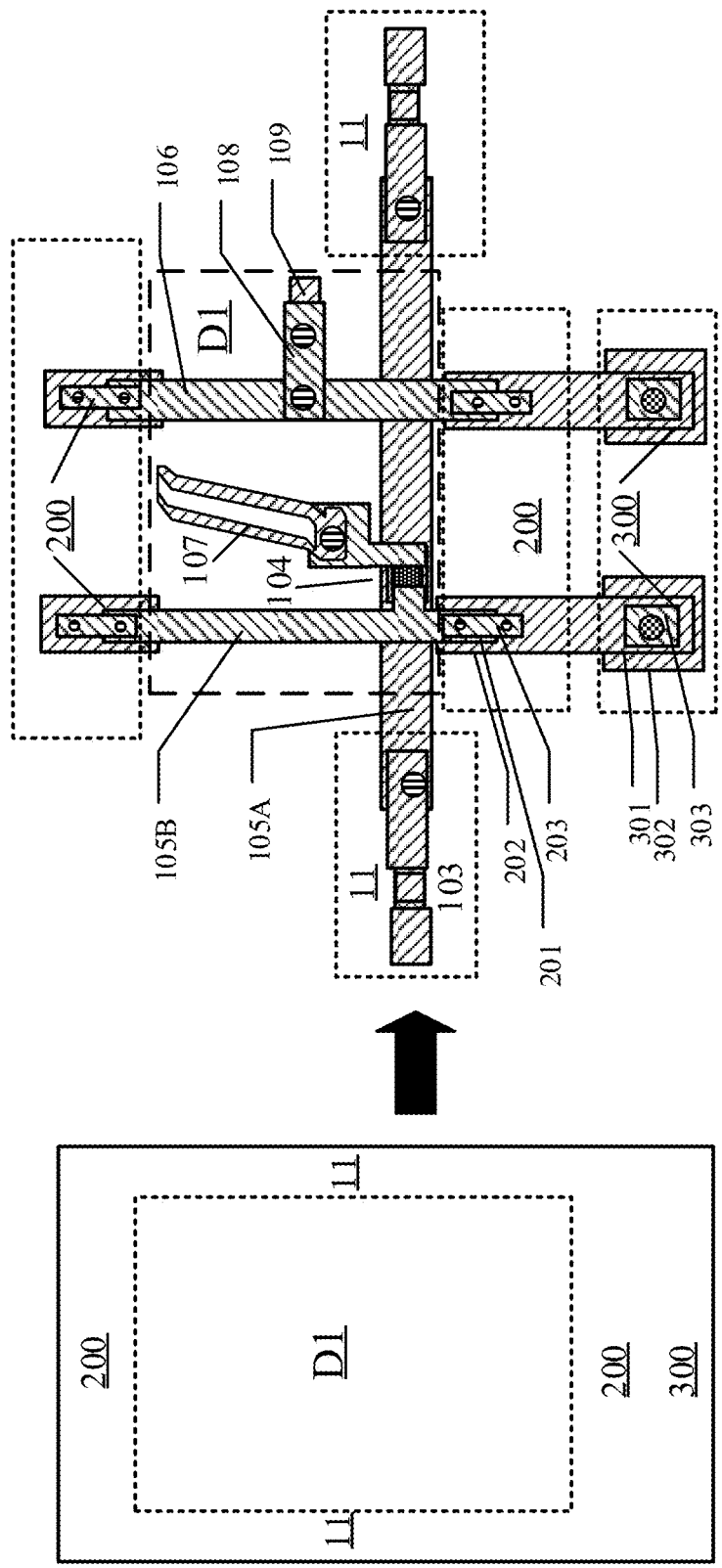
FIG. 5B is a schematically structural plan diagram of an array substrate provided by further still another embodiment of the present disclosure (the left side is a regional schematic diagram, and the right side is a top view of a partial structure of the array substrate)

As illustrated in FIG. 6D, after the first active layer 1042 is formed in the display area D1, for example, the touch wire 106 (and the first electrode 201 corresponding to the touch wire 106 in the connection region 200, refer to FIG. 5B), the first source-drain electrode 1043 of the first thin film transistor 104, the second source-drain electrode 1044 of the first thin film transistor 104, and the data line(s) (and the first electrode 201 corresponding to the data line(s) 105B in the connection region 200, refer to FIG. 5B) can be formed on the first insulating layer 115 by, for example, a sixth mask process. The touch wire 106 is formed on the first insulating layer 115 in the display area D1, and the first source-drain electrode 1043 and the second source-drain electrode 1044 are formed on the first active layer 1042 in the pixel region of the display area D1.

The position of the touch wire 106 includes but is not limited thereto. For example, in another example, the same metal layer may be patterned to form the touch wire 106, the first source-drain electrode 1033 of the second thin film transistor 104, and the second source-drain electrode 1034 of the second thin film transistor 104. In this case, the connection region corresponding to the touch wire 106 does not need to be formed, and the touch wire can directly extend to the bonding region of the peripheral area to be electrically connected to the fourth electrode 301. Examples for the materials of the first source-drain electrode 1043 of the first thin film transistor 104, the second source-drain drain 1044 of the first thin film transistor 104, and the touch wire 106 include aluminum, aluminum alloy, copper, copper alloy, or any other suitable material, and the embodiments of the present disclosure are not limited in this aspect.

Figure 6E:
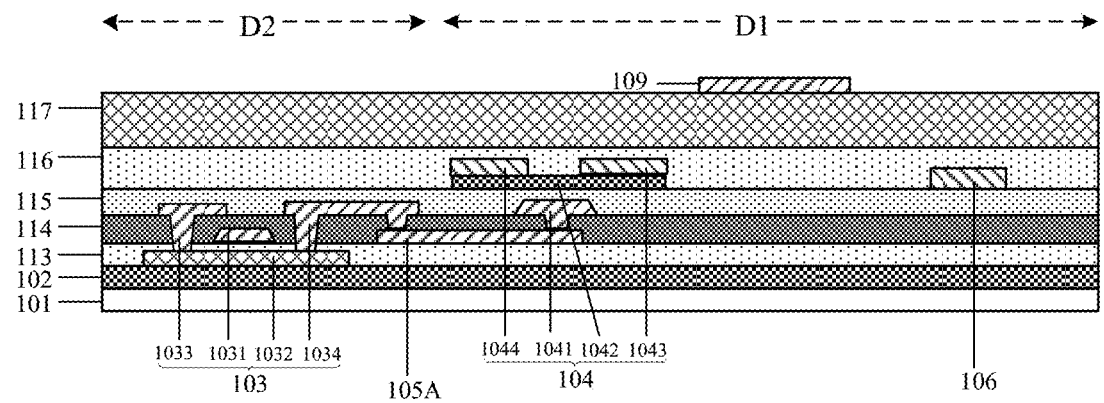

As illustrated in FIG. 6E, after the first source-drain electrode 1043 of the first thin film transistor 104, the second source-drain electrode 1044 of the first thin film transistor 104, and the first touch wire 106 are formed, the first passivation layer 116 can be formed by chemical vapor deposition or physical vapor deposition, etc., and the first passivation layer 116 covers the first source-drain electrode 1043 of the first thin film transistor 104, the second source-drain electrode 1044 of the first thin film transistor 104, and the touch wire 106. Examples for the material of the first passivation layer 116 include SiNx, SiOx, or other suitable materials, and the embodiments of the present disclosure are not limited in this aspect.

As illustrated in FIG. 6E, after the first passivation layer 116 is formed, for example, the planarization layer 117 can be formed on the first passivation layer 116 by a seventh mask process. Examples for the material of the planarization layer 117 include SiNx, SiOx, or other suitable materials, and the embodiments of the present disclosure are not limited in this aspect.

As illustrated in FIG. 6E, for example, the common electrode 109 can be formed on the planarization layer 117 by an eighth mask process, and the common electrode 109 is located in the pixel region of the display area D1 of the array substrate. For example, in an embodiment, the common electrode 109 can also be used as the touch electrode (self-capacitance electrode) for touch operation. Examples for the material of the common electrode 109 includes aluminum, aluminum alloy, copper, copper alloy, ITO, IZO, or other suitable materials, and the embodiments of the present disclosure are not limited in this aspect.

Figure 6F:
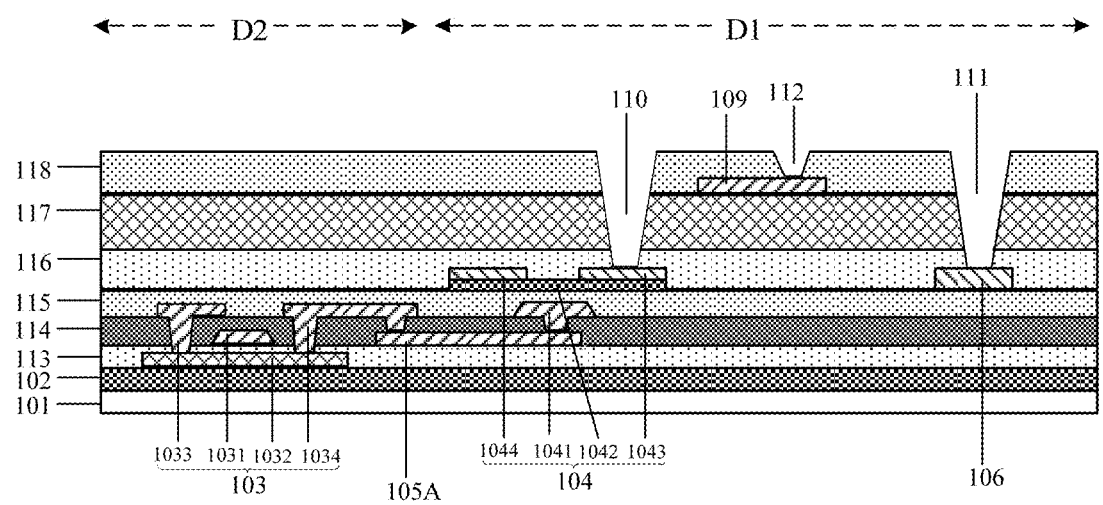

As illustrated in FIG. 6F, after the common electrode 109 is formed, the second passivation layer 118 is formed. For example, the first via hole 110, the second via hole 111, the third via hole 112, the fourth via 204 and the fifth via 205 in the connection region 200, the sixth via 304 in the bonding region 300, and the like, can be formed by a ninth mask process. The first via hole 110, the second via hole 111, the third via hole 112, and the second passivation layer 118 can be formed by using a same mask. The first via hole 110 is through from the second passivation layer 118 to the first passivation layer 116 and exposes at least a portion of the first source-drain electrode 1043, the second via hole 111 is through from the second passivation layer 118 to the first passivation layer 116 and exposes at least a portion of the touch wire 106, and the third via hole 112 is through the second passivation layer 118 and exposes at least a portion of the common electrode 109. The material of the second passivation layer 118 is, for example, an inorganic insulating material, such as SiNx and SiOx, an organic insulating material, such as an organic resin, or other suitable materials, and the embodiments of the present disclosure are not limited in this aspect. For example, the second electrode 202 is exposed through the fourth via hole 204, and the first electrode 201 is exposed through the fifth via hole 205. For example, at least one of the fourth electrode 301 and the fifth electrode 302 is exposed through the sixth via hole 304.

Figure 6G:
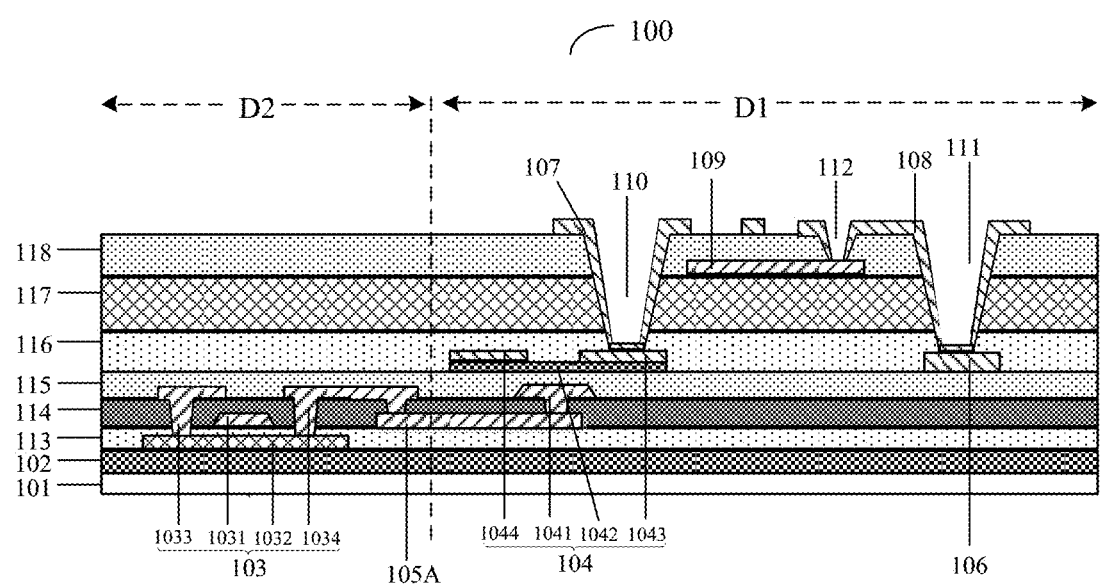

As illustrated in FIG. 6G, after the second passivation layer 118 is formed, for example, the pixel electrode 107, the first connection electrode 108, the second connection electrode 203 in the connection region 200, the third connection electrode 303 in the bonding region 300, and the like, may be formed on the second passivation layer 118 by a tenth mask process. The first connection electrode 108 is formed in the display area D1 of the array substrate, and the pixel electrode 107 is formed in the pixel region of the display area D1 of the array substrate. The pixel electrode 107 is electrically connected to the first source-drain electrode 1043 through the first via hole 110. The first connection electrode 108 is electrically connected to the touch wire 106 and the common electrode 109 through the second via hole 111 and the third via hole 112, respectively, so as to electrically connect the touch wire 106 to the common electrode 109. The first connection electrode 108 electrically connects the touch wire 106 and the common electrode 109 through the second via hole 111 and the third via hole 112, so as to avoid forming via holes by the mask process (for example, via holes formed in the planarization layer 117 and the first passivation layer 116) through which the touch wire 106 and the common electrode 109 are electrically connected directly, which can save the mask process and decrease the production cost. Examples for the materials of the pixel electrode 107 and the first connection electrode 108 includes aluminum, aluminum alloy, copper, copper alloy, molybdenum, molybdenum alloy, titanium, titanium alloy, ITO, IZO, or other suitable materials, and the embodiments of the present disclosure are not limited in this aspect. For example, the second connection electrode 203 electrically connects the first electrode 201 and the second electrode 202 through the fourth via hole 204 and the fifth via hole 205. For example, the fourth electrode 301, the fifth electrode 302, and the third connection electrode 303 are electrically connected to each other.

In the method of manufacturing the array substrate 100 provided by at least one embodiment of the present disclosure, the first thin film transistor 104 is formed in the display area D1 of the array substrate 100, the second thin film transistor 103 is formed in the peripheral area D2 of the array substrate 100, and the first thin film transistor 104 is an oxide thin film transistor. Because the oxide thin film transistor has characteristics of high mobility, good stability, good electrical uniformity, and low off-state leakage current, the contrast ratio of the display area of the display device including the array substrate 100 including the first thin film transistor 104 can be improved, the power consumption of the display device can be decreased, and the display quality of the display device can be improved.

In addition, the touch wire 106, the first source-drain electrode 1043 of the first thin film transistor 104, and the second source-drain electrode 1044 of the first thin film transistor 104 are formed in a same layer. The first connection electrode 108 and the pixel electrode 107 are formed in a same layer. The first gate electrode 1041 of the first thin film transistor 104, the first source-drain electrode 1033 of the second thin film transistor 103, and the second source-drain electrode 1034 of the second thin film transistor 103 are formed in a same layer. The first connection electrode 108 electrically connects the touch wire 106 and the common electrode 109 by the second via hole 111 and the third via hole 112, respectively. In the manufacturing method provided by an embodiment, the array substrate 100 can be substantially formed by ten mask processes, which can save the mask process and decrease the production cost. For example, one mask is used in each mask process, that is, the fabrication of the array substrate can be completed by using ten masks.

For example, in the embodiments of the present disclosure, forming A and B simultaneously may refer to forming A and B in an identical patterning process. A and B can be components/units in the array substrate.

It is to be understood that in the present disclosure, "a/the same layer" refers to a/the layer structure that is formed by a same film forming process for forming a specific pattern, and is formed by one patterning process using the same mask. Depending on specific patterns, the patterning process may include a plurality of exposure, developing, or etching processes, the specific patterns formed in the layer structure may be continuous or discontinuous, and these specific patterns may be at different heights or have different thicknesses.

It is to be understood that, in the embodiments of the present disclosure, the patterning or patterning process may only include a photolithography process, or may include processes, such as photolithography process, or etching step, for forming predetermined patterns.

The manufacturing method provided by the embodiments of the present disclosure has been described above by using the array substrate of the horizontal-electric-field-type liquid crystal display device as an example, but as described above, the embodiments of the present disclosure are not limited thereto. In a case where it is required to form an array substrate of the vertical-electric-field-type liquid crystal display device, an array substrate of the OLED display device, or an array substrate of the electronic paper display device based on the embodiments of the present disclosure, steps of manufacturing methods may be appropriately modified according to structures of the array substrates, and the manufacturing methods of these array substrates are also within the scope of the present disclosure.

The other technical effects of the manufacturing method provided by the embodiments of the present disclosure can refer to the technical effects of the array substrate described in the above embodiments, and details are not repeated herein again.

Without conflicting with each other, elements in an embodiment or in different embodiments of the present disclosure can be combined to form new embodiment(s).

The described above are only exemplary implementations of the present disclosure, and are not intended to limit the embodiments of the present disclosure. The scope of the present disclosure is defined by the claims.

What is claimed is:

1. An array substrate, comprising, a base substrate, a display area and a peripheral area,
    wherein the display area comprises a pixel region, the pixel region comprising a first thin film transistor, and the first thin film transistor comprising a first active layer;
    the peripheral area comprises a second thin film transistor, the second thin film transistor comprising a second active layer;
    the first active layer comprises a material of oxide semiconductor, and the second active layer comprises a material of poly-silicon semiconductor;
    the display area further comprises a touch wire, and the pixel region further comprises a first display electrode and a second display electrode;
    the touch wire, a first source-drain electrode of the first thin film transistor and a second source-drain electrode of the first thin film transistor are in a same layer; and
    the touch wire is electrically connected to the first display electrode;
    wherein the array substrate further comprise an interlayer insulating layer on the base substrate, a first passivation layer on a side of the interlayer insulating layer away from the base substrate, and a second passivation layer on a side of the first passivation layer away from the base substrate, a first via hole is formed in the first passivation layer and the second passivation layer; and
    wherein the display area further comprises a first connection electrode, the first connection electrode and the second display electrode being in a same layer, and the first connection electrode allowing the touch wire and the first display electrode to be electrically connected through a second via hole in the first passivation layer and the second passivation layer and a third via hole in the second passivation layer.

2. The array substrate according to claim 1,
    wherein a first gate electrode of the first thin film transistor and the first active layer of the first thin film transistor are both on a side of the interlayer insulating layer away from the base substrate, and a second gate electrode of the second thin film transistor and the second active layer of the second thin film transistor are both on a side of the interlayer insulating layer near the base substrate.

3. The array substrate according to claim 2,
    wherein the first display electrode is on a side of the first passivation layer away from the base substrate, and the second passivation layer covers the first display electrode; and
    the second display electrode is on a side of the second passivation layer away from the base substrate, and is electrically connected to a first source-drain electrode of the first thin film transistor through the first via hole in the first passivation layer and the second passivation layer.

4. The array substrate according to claim 3, wherein the peripheral area at least comprises a GOA gate drive circuit, the GOA gate drive circuit comprising the second thin film transistor, and a second source-drain electrode of the second thin film transistor being electrically connected to the first gate electrode of the first thin film transistor through a gate line;
    wherein a first source-drain electrode of the second thin film transistor, the second source-drain electrode of the second thin film transistor, and the first gate electrode of the first thin film transistor are in a same layer; and the gate line and the second gate electrode of the second thin film transistor are in a same layer.

5. The array substrate according to claim 4, wherein the gate line and the second gate electrode are insulated from each other.

6. The array substrate according to claim 3, wherein the peripheral area further comprises a connection region, and the connection region comprises a first electrode, a second electrode, and a second connection electrode,
    wherein the first electrode, the first source-drain electrode of the first thin film transistor, and the second source-drain electrode of the first thin film transistor are in a same layer;
    a second electrode, a first source-drain electrode of the second thin film transistor, and a second source-drain electrode of the second thin film transistor are in a same layer; and
    the second connection electrode and the second display electrode are in a same layer, and the second connection electrode allows the first electrode and the second electrode to be electrically connected through a fourth via hole in the first passivation layer and the second passivation layer and a fifth via hole in the first passivation layer and the second passivation layer.

7. The array substrate according to claim 3, wherein the peripheral area further comprises a bonding region, the bonding region comprising a fourth electrode, a fifth electrode, and a third connection electrode,
    wherein the fourth electrode, a first source-drain electrode of the second thin film transistor, and a second source-drain electrode of the second thin film transistor are in a same layer;
    the fifth electrode and the second gate electrode of the second thin film transistor are in a same layer; and
    the third connection electrode and the second display electrode are in a same layer, and the fourth electrode, the fifth electrode and the third connection electrode are electrically connected to each other.

8. The array substrate according to claim 2, further comprising a first passivation layer on a side of the interlayer insulating layer away from the base substrate, and a second passivation layer on a side of the first passivation layer away from the base substrate,
    wherein the pixel region further comprises a first display electrode and a second display electrode, the second display electrode being on a side of the first passivation layer away from the base substrate, and the second passivation layer covering the second display electrode;
    the first display electrode is on a side of the second passivation layer away from the base substrate;
    the array substrate further comprises a fourth connection electrode, the fourth connection electrode and the first display electrode being in a same layer and insulated from each other; and
    the second display electrode is electrically connected to the first source-drain electrode of the first thin film transistor through the fourth connection electrode.

9. The array substrate according to claim 1, wherein the first connection electrode and the second display electrode are insulated from each other.

10. A display panel, comprising an array substrate, wherein the array substrate comprises: a base substrate, a display area, and a peripheral area,
    wherein the display area comprises a pixel region, the pixel region comprising a first thin film transistor, and the first thin film transistor comprising a first active layer;
    the peripheral area comprises a second thin film transistor, the second thin film transistor comprising a second active layer;
    the first active layer comprises a material of oxide semiconductor, and the second active layer comprises a material of poly-silicon semiconductor;
    wherein the display area further comprises a touch wire, and the pixel region further comprises a first display electrode and a second display electrode;
    the touch wire, a first source-drain electrode of the first thin film transistor and a second source-drain electrode of the first thin film transistor are in a same layer;
    the touch wire is electrically connected to the first display electrode;
    wherein the array substrate further comprise an interlayer insulating layer on the base substrate, a first passivation layer on a side of the interlayer insulating layer away from the base substrate, and a second passivation layer on a side of the first passivation layer away from the base substrate, a first via hole is formed in the first passivation layer and the second passivation layer; and
    wherein the display area further comprises a first connection electrode, the first connection electrode and the second display electrode being in a same layer, and the first connection electrode allowing the touch wire and the first display electrode to be electrically connected through a second via hole in the first passivation layer and the second passivation layer and a third via hole in the second passivation layer.

11. An electronic device, comprising the display panel according to claim 10.

12. The display panel according to claim 10, wherein a first gate electrode of the first thin film transistor and the first active layer of the first thin film transistor are both on a side of the interlayer insulating layer away from the base substrate, and a second gate electrode of the second thin film transistor and the second active layer of the second thin film transistor are both on a side of the interlayer insulating layer near the base substrate.

13. The display panel according to claim 12, wherein the first display electrode is on a side of the first passivation layer away from the base substrate, and the second passivation layer covers the first display electrode; and the second display electrode is on a side of the second passivation layer away from the base substrate, and the second display electrode is electrically connected to a first source-drain electrode of the first thin film transistor through the first via hole in the first passivation layer and the second passivation layer.

14. A method of manufacturing an array substrate, wherein the array substrate comprises, a base substrate, a display area and a peripheral area, the display area comprising a pixel region, and the method comprises:
    forming a first thin film transistor in the pixel region, wherein the forming of the first thin film transistor comprises forming a first active layer;

forming a second thin film transistor in the peripheral area, wherein the forming of the second thin film transistor comprises forming a second active layer;
wherein the first active layer comprises a material of oxide semiconductor, and the second active layer comprises a material of poly-silicon semiconductor;
forming a touch wire in the display area; and
forming a first display electrode and a second display electrode in the pixel region;
the touch wire, a first source-drain electrode of the first thin film transistor and a second source-drain electrode of the first thin film transistor are formed simultaneously in a same layer;
the touch wire is electrically connected to the first display electrode;
wherein the method further comprises:
forming a first passivation layer and a second passivation layer sequentially on the base substrate to cover the first thin film transistor and the second thin film transistor;
forming the first display electrode between the first passivation layer and the second passivation layer in the pixel region;
after the second passivation layer is formed, forming a first via hole by an etching process to expose the first source-drain electrode of the first thin film transistor, forming a second via hole to expose the touch wire, and forming a third via hole to expose the first display electrode;
forming a third conductive thin film and patterning the third conductive thin film to form the first source-drain electrode of the first thin film transistor and the second source-drain electrode of the first thin film transistor; and
forming a fourth conductive thin film and patterning the fourth conductive thin film to form the second display electrode and a first connection electrode;
wherein the first connection electrode allows the touch wire and the first display electrode to be electrically connected through a second via hole in the first passivation layer and the second passivation layer and a third via hole in the second passivation layer.

15. The method according to claim 14, wherein the peripheral area at least comprises a GOA gate drive circuit, the GOA gate drive circuit comprising the second thin film transistor, and the method further comprises:
patterning a first conductive thin film to form a gate line and a second gate electrode of the second thin film transistor; and
patterning a second conductive thin film to form a first source-drain electrode of the second thin film transistor, a second source-drain electrode of the second thin film transistor, and a first gate electrode of the first thin film transistor, wherein the second source-drain electrode of the second thin film transistor is electrically connected to the first gate electrode of the first thin film transistor through the gate line.

16. The method according to claim 14, further comprising:
wherein the second display electrode and the first connection electrode are insulated from each other, the second display electrode is electrically connected to the first source-drain electrode of the first thin film transistor through the first via hole, and the first connection electrode is electrically connected to the touch wire and the first display electrode through the second via hole and the third via hole, respectively.

17. The method according to claim 16, further comprising:
forming a first electrode and a second electrode in a connection region of the peripheral area, wherein the first source-drain electrode of the first thin film transistor, the second source-drain electrode of the first thin film transistor, and the first electrode are simultaneously formed, and the first source-drain electrode of the second thin film transistor, the second source-drain electrode of the second thin film transistor, and the second electrode are simultaneously formed;
forming a fourth via hole to expose the second electrode and forming a fifth via hole to expose the first electrode, wherein the first via hole, the second via hole, the third via hole, the fourth via hole, and the fifth via hole are simultaneously formed; and
forming a second connection electrode, wherein the second display electrode and the second connection electrode are simultaneously formed, and the second connection electrode allows the first electrode and the second electrode to be electrically connected through the fourth via hole and the fifth via hole.

18. The method according to claim 17, further comprising:
forming a fourth electrode and a fifth electrode in a bonding region of the peripheral area, wherein the first source-drain electrode of the second thin film transistor, the second source-drain electrode of the second thin film transistor, and the fourth electrode are simultaneously formed, and the second gate electrode of the second thin film transistor and the fifth electrode are simultaneously formed;
forming a sixth via hole to expose at least one of the fourth electrode and the fifth electrode, wherein the first via hole, the second via hole, the third via hole, the fourth via hole, the fifth via hole, and the sixth via hole are simultaneously formed; and
forming a third connection electrode, wherein the third connection electrode and the second display electrode are simultaneously formed, and the fourth electrode, the fifth electrode, and the third connection electrode are electrically connected to each other.

19. The method according to claim 18, wherein the first via hole, the second via hole, the third via hole, the fourth via hole, the fifth via hole, and the sixth via hole are formed by using a same mask.

* * * * *